US012408511B2

(12) United States Patent
Kim

(10) Patent No.: US 12,408,511 B2
(45) Date of Patent: Sep. 2, 2025

(54) THIN-FILM TRANSISTOR SUBSTRATE AND DISPLAY APPARATUS INCLUDING THE SAME

(71) Applicant: SAMSUNG DISPLAY CO., LTD., Yongin-si (KR)

(72) Inventor: Keunwoo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 699 days.

(21) Appl. No.: 17/573,956

(22) Filed: Jan. 12, 2022

(65) Prior Publication Data

US 2022/0376117 A1  Nov. 24, 2022

(30) Foreign Application Priority Data

May 18, 2021  (KR) .................. 10-2021-0064213

(51) Int. Cl.
| H10K 59/121 | (2023.01) |
| H10D 30/67 | (2025.01) |
| H10K 50/844 | (2023.01) |
| H10K 59/80 | (2023.01) |

(52) U.S. Cl.
CPC ..... H10K 59/1213 (2023.02); H10D 30/6755 (2025.01); H10D 30/6757 (2025.01); H10K 50/844 (2023.02); H10K 59/1216 (2023.02); H10K 59/873 (2023.02)

(58) Field of Classification Search
None
See application file for complete search history.

(56) References Cited

U.S. PATENT DOCUMENTS

| 8,624,255 | B2 | 1/2014 | Won et al. | |
| 10,490,660 | B2 | 11/2019 | Cha et al. | |
| 2007/0296003 | A1 | 12/2007 | Park et al. | |
| 2010/0006851 | A1* | 1/2010 | Park | H01L 29/41733 |
| | | | | 257/E21.16 |
| 2011/0140116 | A1* | 6/2011 | Morosawa | H01L 29/7869 |
| | | | | 257/E29.273 |
| 2014/0225075 | A1* | 8/2014 | Zhan | H01L 29/78672 |
| | | | | 257/66 |

(Continued)

FOREIGN PATENT DOCUMENTS

| KR | 1020070117309 A | 12/2007 |
| KR | 100924493 B1 | 11/2009 |

(Continued)

*Primary Examiner* — Yara B Green
*Assistant Examiner* — Fakeha Sehar
(74) *Attorney, Agent, or Firm* — CANTOR COLBURN LLP

(57) ABSTRACT

A thin-film transistor substrate includes: a substrate; a semiconductor layer on the substrate, where the semiconductor layer includes a first conductive region, a second conductive region, and a first channel region between the first conductive region and the second conductive region; a gate insulating layer on the semiconductor layer, where the gate insulating layer includes a first charge implanted region which overlaps a portion of the first channel region and into which charged ions are implanted; and a first gate electrode on the gate insulating layer to overlap the first channel region. The first charge implanted region is shifted to the first conductive region or the second conductive region.

10 Claims, 16 Drawing Sheets

(56) References Cited

U.S. PATENT DOCUMENTS

2020/0342815 A1 10/2020 Kim et al.
2021/0134906 A1 5/2021 Lee et al.

FOREIGN PATENT DOCUMENTS

| KR | 1020100005778 A | 1/2010 |
| KR | 101749265 B1 | 6/2017 |
| KR | 1020190027407 A | 3/2019 |
| KR | 1020190048252 A | 5/2019 |
| KR | 1020200124365 A | 11/2020 |
| KR | 1020210052730 A | 5/2021 |

* cited by examiner

THIN-FILM TRANSISTOR SUBSTRATE AND DISPLAY APPARATUS INCLUDING THE SAME

This application claims priority to Korean Patent Application No. 10-2021-0064213, filed on May 18, 2021, and all the benefits accruing therefrom under 35 U.S.C. § 119, the content of which in its entirety is herein incorporated by reference.

BACKGROUND

1. Field

One or more embodiments relate to a thin-film transistor substrate and a display apparatus including the thin-film transistor substrate.

2. Description of the Related Art

Display apparatuses are configured to display data visually. Display apparatuses may be used as displays for small products such as mobile phones or large products such as televisions.

A display apparatus typically includes a plurality of pixels that receive an electrical signal and emit light to display an image to the outside. Each of the pixels may include a display element. Among various types of display apparatus, an organic light-emitting display includes an organic light-emitting diode ("OLED") as a display element, for example.

In general, a display apparatus includes thin-film transistors and a capacitor to control light emission of pixels. The thin-film transistor may include, for example, a semiconductor layer including polysilicon and a gate electrode overlapping at least a portion of the semiconductor layer. The semiconductor layer includes a channel region and a source/drain region doped with impurities on sides of the channel region. The thin-film transistor may generate a leakage current due to a short channel effect or a hot electron effect. Accordingly, various methods have been proposed to prevent such a leakage current.

SUMMARY

One or more embodiments include a thin-film transistor substrate in which the occurrence of a leakage current is effectively prevented or substantially minimized, and a display apparatus including the thin-film transistor substrate.

According to an embodiment of the invention, a thin-film transistor substrate includes a substrate, a semiconductor layer on the substrate, where the semiconductor layer includes a first conductive region, a second conductive region, and a first channel region between the first conductive region and the second conductive region, a gate insulating layer on the semiconductor layer, where the gate insulating layer includes a first charge implanted region which overlaps a portion of the first channel region and into which charged ions are implanted, and a first gate electrode on the gate insulating layer to overlap the first channel region.

In an embodiment, the first charge implanted region may be shifted to the first conductive region or the second conductive region.

In an embodiment, the first conductive region and the second conductive region may include a P-type dopant, and the charged ions implanted into the first charge implanted region may have a negative charge.

In an embodiment, the charged ions implanted into the first charge implanted region may include at least one selected from $F^-$, $Cl^-$, $O^{2-}$, and $P^{3-}$.

In an embodiment, a concentration of the charged ions implanted into the first charge implanted region may be less than a concentration of a dopant doped into the first conductive region.

In an embodiment, an area of the first charge implanted region may be less than about a half (½) of an area of the first channel region.

In an embodiment, a width of the first charge implanted region may be less than about a half (½) of a width of the first channel region.

In an embodiment, the first charge implanted region may be shifted to the second conductive region, and the second conductive region may be a drain region.

In an embodiment, the semiconductor layer may further include a second channel region apart from the first channel region, and the gate insulating layer may further include a second charge implanted region overlapping the second channel region, where the second conductive region may be between the first channel region and the second channel region.

In an embodiment, a distance between a center of the first charge implanted region and the second conductive region may be less than a distance between a center of the first channel region and the second conductive region, and a distance between a center of the second charge implanted region and the second conductive region may be less than a distance between a center of the second channel region and the second conductive region.

In an embodiment, a distance between a center of the first charge implanted region and the second conductive region may be greater than a distance between a center of the first channel region and the second conductive region, and a distance between a center of the second charge implanted region and the second conductive region may be greater than a distance between a center of the second channel region and the second conductive region.

In an embodiment, a thickness of the first charge implanted region may be less than a thickness of the gate insulating layer.

According to an embodiment of the invention, a display apparatus includes a substrate, a pixel circuit on the substrate, the pixel circuit including a first thin-film transistor, and a display element electrically connected to the pixel circuit. In such an embodiment, the first thin-film transistor includes a semiconductor layer on the substrate, where the semiconductor layer includes a first conductive region, a second conductive region, and a first channel region between the first conductive region and the second conductive region, a gate insulating layer on the semiconductor layer, where the gate insulating layer includes a first charge implanted region which overlaps a portion of the first channel region and into which charged ions are implanted, and a first gate electrode on the gate insulating layer to overlap the first channel region.

In an embodiment, the first charge implanted region may be shifted to the first conductive region or the second conductive region.

In an embodiment, the first conductive region and the second conductive region may include a P-type dopant, and the charged ions implanted into the first charge implanted region may have a negative charge.

In an embodiment, the charged ions implanted into the first charge implanted region may include at least one selected from $F^-$, $Cl^-$, $O^{2-}$, and $P^{3-}$.

In an embodiment, a concentration of the charged ions implanted into the first charge implanted region may be less than a concentration of a dopant doped into the first conductive region.

In an embodiment, the semiconductor layer may further include a second channel region apart from the first channel region, and the gate insulating layer may further include a second charge implanted region overlapping the second channel region, where the second conductive region may be between the first channel region and the second channel region.

In an embodiment, a distance between a center of the first charge implanted region and the second conductive region may be less than a distance between a center of the first channel region and the second conductive region, and a distance between a center of the second charge implanted region and the second conductive region may be less than a distance between a center of the second channel region and the second conductive region.

In an embodiment, the pixel circuit may further include a capacitor, and the capacitor may overlap the first thin-film transistor.

In an embodiment, the pixel circuit may further include an oxide thin-film transistor including an oxide semiconductor layer, and the oxide thin-film transistor may be in a layer different from the first thin-film transistor.

In an embodiment, the display element may include an organic light-emitting diode, where the organic-light emitting diode may include a pixel electrode, an intermediate layer including an emission layer, and an opposite electrode, which are stacked one on another.

In an embodiment, the display apparatus may further include a thin-film encapsulation layer which covers the display element, where the thin-film encapsulation layer may include a first inorganic encapsulation layer, an organic encapsulation layer, and a second inorganic encapsulation layer, which are stacked one on another.

BRIEF DESCRIPTION OF THE DRAWINGS

The above and other features of the invention will become more apparent by describing in further detail embodiments with reference to the accompanying drawings, in which.

DETAILED DESCRIPTION

Figure 1:
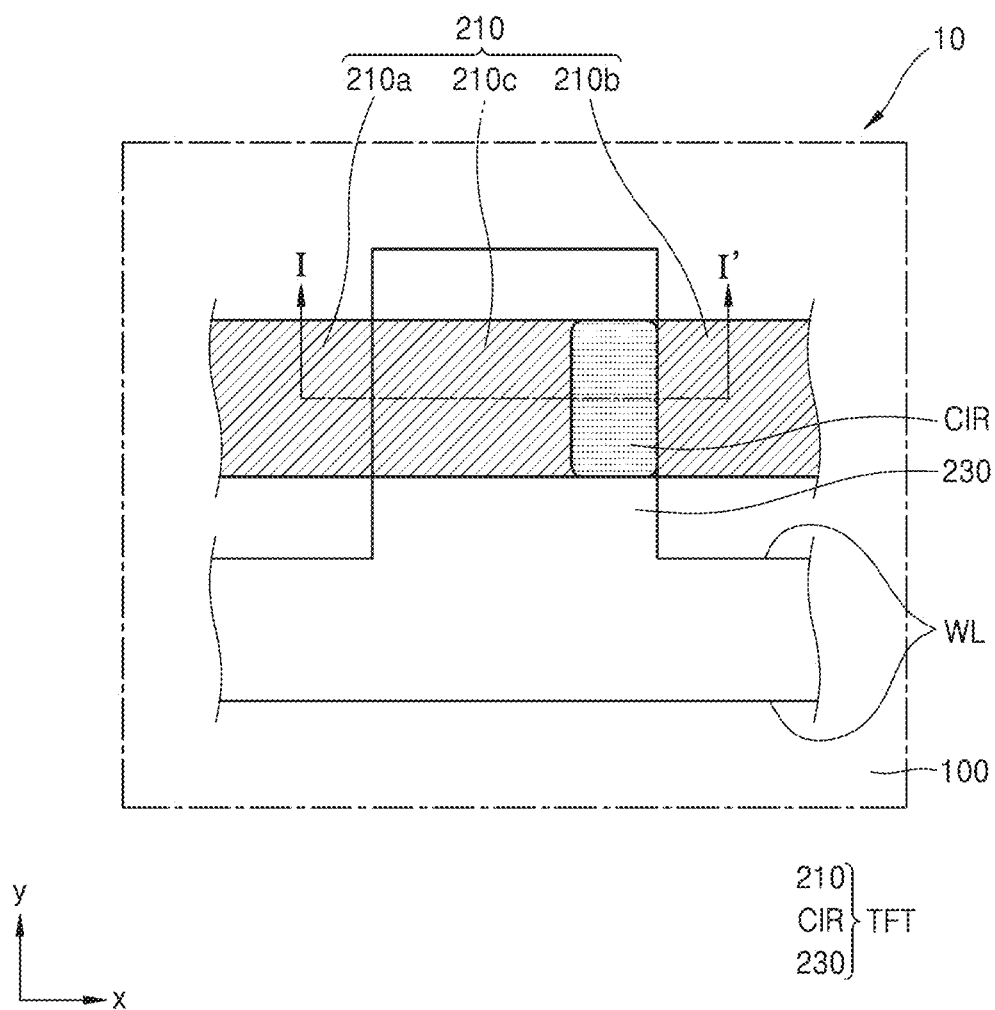
FIG. 1 is a plan view schematically illustrating a thin-film transistor substrate according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Hereinafter, embodiments of the invention will be described in detail with reference to the accompanying drawings.

Figure 2:
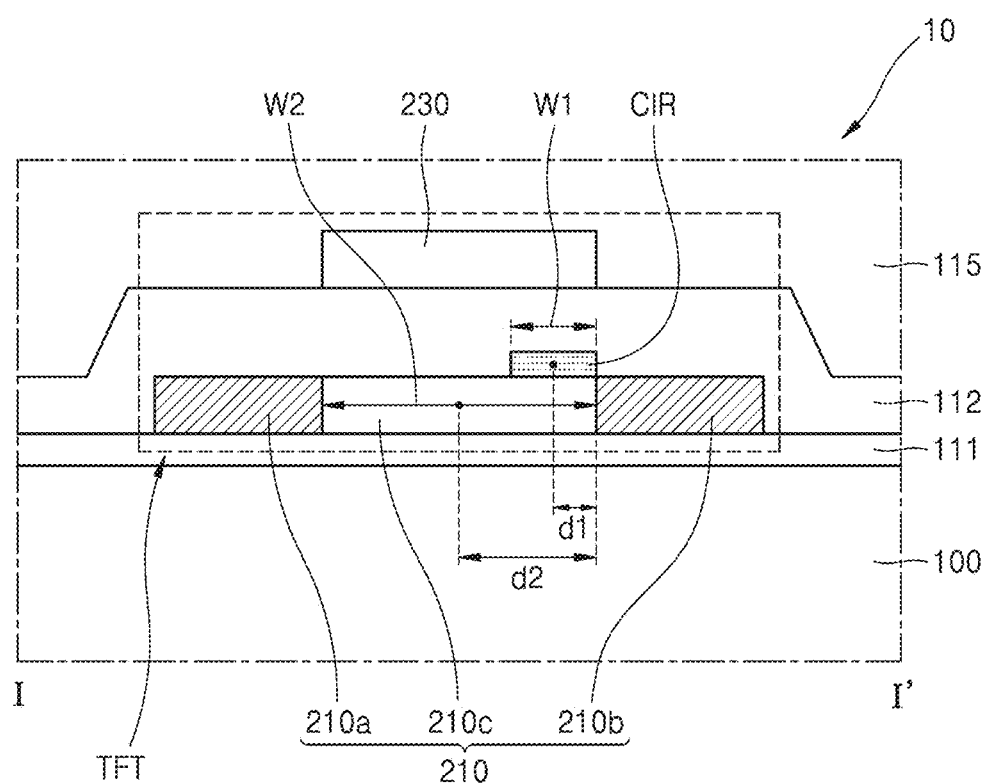
FIG. 2 is a cross-sectional view of the thin-film transistor substrate of FIG. 1 taken along line I-I'.

FIG. 1 is a plan view schematically illustrating a thin-film transistor substrate 10 according to an embodiment, and FIG. 2 is a cross-sectional view of the thin-film transistor substrate 10 of FIG. 1 taken along line I-I'.

Referring to FIGS. 1 and 2, an embodiment of the thin-film transistor substrate 10 may include a substrate 100 and a thin-film transistor TFT on the substrate 100. Herein, the thin-film transistor substrate 10 may refer to any device including the thin-film transistor TFT. In one embodiment, for example, the thin-film transistor substrate 10 may be a thin-film transistor array substrate or a display apparatus, such as an organic light-emitting display, an inorganic light-emitting display, or a liquid crystal display, in which a plurality of thin-film transistors TFT are arranged.

In an embodiment, the thin-film transistor TFT includes a semiconductor layer 210, a gate insulating layer 112, and a gate electrode 230. The semiconductor layer 210 is on the substrate 100 and includes a first conductive region 210a, a second conductive region 210b, and a channel region 210c between the first conductive region 210a and the second conductive region 210b. The gate insulating layer 112 is on the semiconductor layer 210 and includes a charge implanted region CIR which partially overlaps (or overlaps a portion of) the channel region 210c and into which charged ions are implanted. The gate electrode 230 is on the gate insulating layer 112 to overlap the channel region 210c. In an embodiment, the charge implanted region CIR may be shifted to the first conductive region 210a or the second conductive region 210b, that is, disposed closer to one of the first conductive region 210a and the second conductive region 210b than the other of the first conductive region 210a and the second conductive region 210b.

The substrate 100 may include a glass material, a ceramic material, a metal material, or a flexible or bendable material. In an embodiment where the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layer structure or a multilayer structure, each layer including at least one selected from the above-described material. In an embodiment where the substrate 100 has a multilayer structure, the substrate 100 may further include an inorganic layer. In an embodiment, the substrate 100 may have an organic/inorganic/organic structure.

A buffer layer 111 may be on the substrate 100. The buffer layer 111 may prevent diffusion of impurity ions and infiltration penetration of moisture or ambient air, and may provide a planarized surface. The buffer layer 111 may include an inorganic material such as an oxide or a nitride, an organic material, or an organic/inorganic composite material, and may have a single-layer structure or a multilayer structure, each layer including an inorganic material or an organic material. In an embodiments, the buffer layer 111 may include silicon oxide ($SiO_2$), silicon nitride ($SiN_x$), or silicon oxynitride ($SiO_xN_y$).

The display apparatus 1 may further include a barrier layer (not illustrated) between the substrate 100 and the buffer layer 111. The barrier layer may prevent or minimize infiltration of impurities from the substrate 100 or the like into the semiconductor layer 210. The barrier layer may include an inorganic material such as an oxide or a nitride, an organic material, or an organic/inorganic composite material, and may have a single-layer structure or a multilayer structure, each layer including an inorganic material or an organic material.

The thin-film transistor TFT may be on the buffer layer 111. The thin-film transistor TFT may include a semiconductor layer 210 in which a channel is formed or defined, a gate electrode 230 to which an electric field is applied to form the channel, and a gate insulating layer 112 between the semiconductor layer 210 and the gate electrode 230.

The semiconductor layer 210 may include amorphous silicon or polysilicon. The semiconductor layer 210 may include the first conductive region 210a, the second conductive region 210b, and the channel region 210c.

In an embodiment, where the thin-film transistor TFT is a P-type transistor, the first conductive region 210a and the second conductive region 210b may be doped with a P-type dopant such as Group III elements. In an embodiment, where the thin-film transistor TFT is an N-type transistor, the first conductive region 210a and the second conductive region 210b may be doped with an N-type dopant such as Group V elements. In such an embodiment, one of the first conductive region 210a and the second conductive region 210b may be a source region, and the other thereof may be a drain region.

FIG. 1 illustrates an embodiment where the channel region 210c is provided in a straight line or has a linear shape, but the disclosure is not limited thereto. In an alternative embodiment, the channel region 210c or the semiconductor layer 210 may include a portion that is bent at least once. In one embodiment, for example, the channel region 210c or the semiconductor layer 210 may have a shape that is bent multiple times, such as an omega-like (Ω) shape or an "S"-like shape. The shape of the semiconductor layer 210 may be variously modified according to design.

The gate insulating layer 112 may cover the semiconductor layer 210 and may be on the buffer layer 111. The gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), or hafnium oxide ($HfO_2$). The gate insulating layer 112 may include a single layer or multiple layers, each layer including at least one selected from the above-described inorganic insulating material.

The gate insulating layer 112 includes the charge implanted region CIR. The charge implanted region CIR is a region into which charged ions are implanted, and may be arranged to overlap the channel region 210c of the semiconductor layer 210.

In an embodiment, where the thin-film transistor is a P-type transistor, negatively charged ions may be implanted into the charge implanted region CIR. In an embodiment, the ions implanted into the charge implanted region CIR may be $F^-$, $Cl^-$, $O^{2-}$, or $P^{3-}$. In an embodiment, where the thin-film transistor is an N-type transistor, positively charged ions may be implanted into the charge implanted region CIR.

The charge implanted region CIR may overlap the channel region 210c and may be arranged adjacent to one of the first conductive region 210a and the second conductive region 210b. The conductive region adjacent to the charge implanted region CIR may be the drain region. The center of the charge implanted region CIR may be arranged closer to the drain region than a center of the channel region 210c. In one embodiment, for example, a distance d1 between a center of the charge implanted region CIR and the second conductive region 210b acting as the drain region may be less than a distance d2 between the center of the channel region 210c and the second conductive region 210b.

The concentration of the ions implanted into the charge implanted region CIR may be less than the concentration of the dopant doped into the first conductive region 210a and the second conductive region 210b. In an embodiment, the concentration of the ions implanted into the charge implanted region CIR may be in a range of about 3E11 to about 3E12 (i.e., about $3 \times 10^{11}$ to about $3 \times 10^{12}$) ions/$cm^2$.

The charge implanted region CIR may reduce a leakage current when the thin-film transistor TFT is turned off. Ideally, when a high level voltage is applied to the gate electrode of the P-type transistor, the P-type transistor is turned off so that no leakage current occurs. However, due to a gate induced drain leakage ("GIDL"), a leakage current may occur even when a high level voltage is applied to the gate electrode. The main cause of the GIDL may be tunneling by an electric field generated between the gate electrode and the drain region.

In an embodiment of the invention, the GIDL may be alleviated by providing the charge implanted region CIR into the gate insulating layer 112 to partially offset an electric field between the gate electrode and the drain region.

The area of the charge implanted region CIR may be less than the area of the channel region 210c. In one embodiment, for example, the area of the charge implanted region CIR may be less than about a half (½) of the area of the channel region 210c. A width W1 of the charge implanted region CIR may be less than a width W2 of the channel region 210c or a width of the gate electrode 230. The width W1 of the charge implanted region CIR may be less than about a half (½) of the width W2 of the channel region 210c.

The gate electrode 230 may be on the gate insulating layer 112. The gate electrode 230 may overlap at least a portion of the semiconductor layer 210. The gate electrode 230 may be arranged to overlap the channel region 210c of the semiconductor layer 210. The gate electrode 230 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single layer structure or a multilayer structure, each layer including at least one selected from the above-described material.

In an embodiment, as illustrated in FIG. 1, the gate electrode 230 may be integrally formed with a line WL, through which a gate voltage is applied, as a single unitary unit. In an embodiment, the line WL may extend in the x direction, and the gate electrode 230 may protrude from the line WL in the y direction. In such an embodiment, the gate electrode 230 may be defined by a protruded portion of the line WL.

An interlayer insulating layer 115 may cover the gate electrode 230 and be on the gate insulating layer 112. The interlayer insulating layer 115 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), or hafnium oxide ($HfO_2$). The interlayer insulating layer 115 may have a single layer structure or a multilayer structure, each layer including at least one selected from the above-described inorganic insulating material.

In an embodiment of the thin-film transistor substrate 10, as described above, the charge implanted region CIR may be provided in the gate insulating layer 112 to reduce a leakage current that may occur when the thin-film transistor TFT is turned off.

Figure 3:
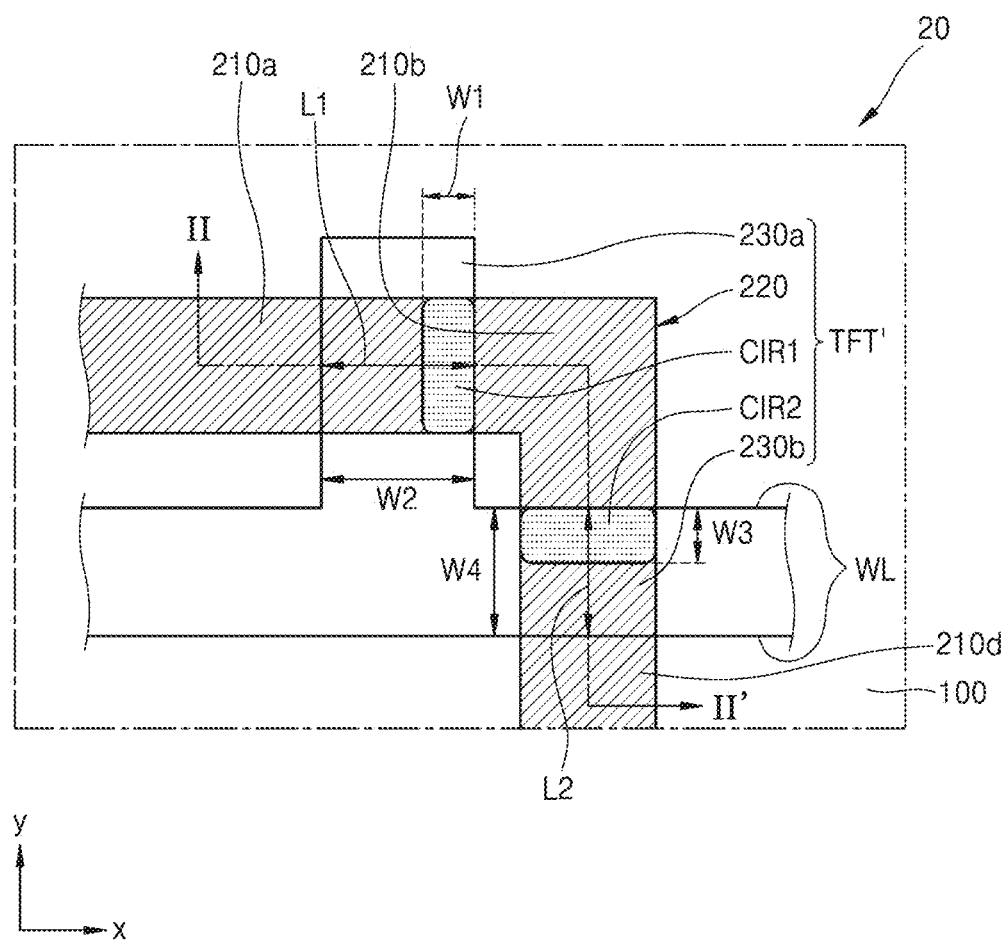
FIG. 3 is a plan view schematically illustrating a thin-film transistor substrate according to an alternative embodiment.
Figure 4:
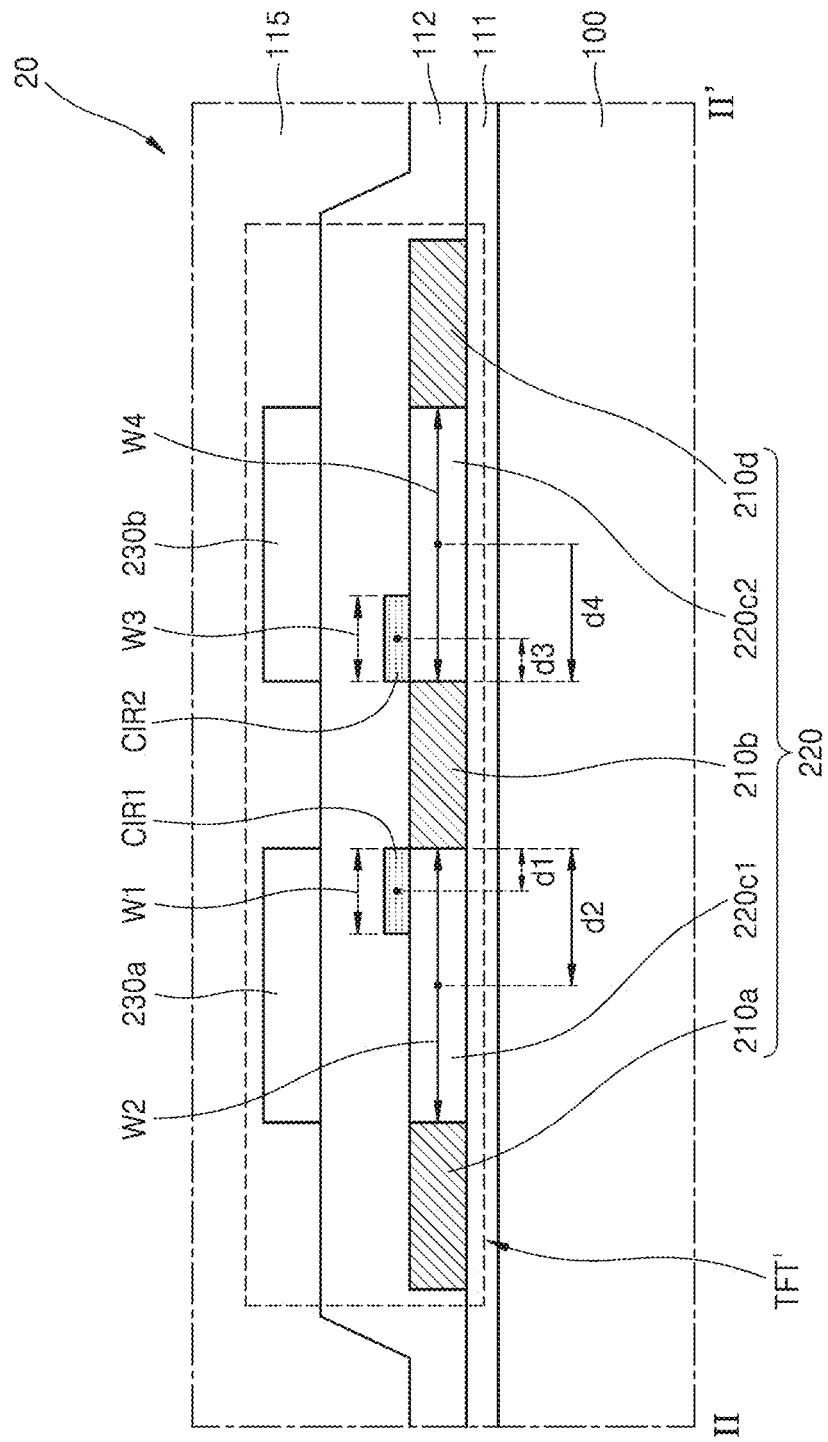
FIG. 4 is a cross-sectional view of the thin-film transistor substrate of FIG. 3 taken along line II-II'.

FIG. 3 is a plan view schematically illustrating a thin-film transistor substrate 20 according to an alternative embodiment, and FIG. 4 is a cross-sectional view of the thin-film transistor substrate 20 of FIG. 3 taken along line II-II'. In FIGS. 3 and 4, the same or like reference numerals as those in FIG. 3 denote the same or like elements, and any repetitive detailed descriptions thereof will be omitted or simplified.

Referring to FIGS. 3 and 4, an embodiment of the thin-film transistor substrate 20 may include a substrate 100 and a thin-film transistor TFT' on the substrate 100. The thin-film transistor TFT' may have a dual gate structure including a first gate electrode 230a and a second gate electrode 230b. In the thin-film transistor TFT', two transistors are connected in series to each other, and a same gate voltage is applied to the first gate electrode 230a and the second gate electrode 230b.

The thin-film transistor TFT' includes a semiconductor layer 220, a gate insulating layer 112, and a first gate electrode 230a. The semiconductor layer 220 is on the substrate 100 and includes a first conductive region 210a, a second conductive region 210b, and a first channel region 220c1 between the first conductive region 210a and the second conductive region 210b. The gate insulating layer 112 is on the semiconductor layer 220 and includes a first charge implanted region CIR1 which partially overlaps (or overlaps a portion of) the first channel region 220c1 and into which charged ions are implanted. The first gate electrode 230a is on the gate insulating layer 112 to overlap the first channel region 220c1. In such an embodiment, the first charge implanted region CIR1 may be shifted to the first conductive region 210a or the second conductive region 210b.

In such an embodiment, the semiconductor layer 220 of the thin-film transistor TFT' may further include a second channel region 220c2 and a third conductive region 210d. The second channel region 220c2 may be between the second conductive region 210b and the third conductive region 210d. The second conductive region 210b may be between the first channel region 220c1 and the second channel region 220c2. In such an embodiment, the second conductive region 210b may act as a drain region for the first channel region 220c1 and a source region for the second channel region 220c2. Alternatively, the second conductive region 210b may act as a source region for the first channel region 220c1 and a drain region for the second channel region 220c2.

The gate insulating layer 112 may further include a second charge implanted region CIR2 which partially overlaps (or overlaps a portion of) the second channel region 220c2 and into which charged ions are implanted.

In an embodiment, where the thin-film transistor TFT' is a P-type transistor, negatively charged ions may be implanted into the first charge implanted region CIR1 and the second charge implanted region CIR2. In an embodiment, the ions implanted into the first charge implanted region CIR1 and the second charge implanted region CIR2 may be $F^-$, $Cl^-$, $O^{2-}$, or $P^{3-}$. In an embodiment, where the thin-film transistor TFT' is an N-type transistor, positively charged ions may be implanted into the first charge implanted region CIR1 and the second charge implanted region CIR2.

The concentration of the ions implanted into the first charge implanted region CIR1 and the second charge implanted region CIR2 may be less than the concentration of the dopant doped into the first conductive region 210a and the second conductive region 210b. In an embodiment, the concentration of the ions implanted into the first charge implanted region CIR1 and the second charge implanted region CIR2 may be in a range of about 3E11 to about 3E12 (i.e., about $3 \times 10^{11}$ to about $3 \times 10^{12}$) ions/cm$^2$. In one alternative embodiment, for example, the concentration of the dopant doped into the first conductive region 210a and the second conductive region 210b may be about 1E15 ($1 \times 10^{15}$) ions/cm$^2$.

In such an embodiment, the first charge implanted region CIR1 and the second charge implanted region CIR2 are shifted to the second conductive regions 210b between the first channel region 220c1 and the second channel region 220c2. In one embodiment, for example, a distance d1 between a center of the first charge implanted region CIR1 and the second conductive region 210b may be less than a distance d2 between the center of the first channel region 220c1 and the second conductive region 210b, and a distance d3 between a center of the second charge implanted region CIR2 and the second conductive region 210b may be less than a distance d4 between the center of the second channel region 220c2 and the second conductive region 210b. The distances d1 to d4 may refer to the shortest distances.

In an embodiment where the thin-film transistor TFT' has a dual gate structure, both the first charge implanted region CIR1 and the second charge implanted region CIR2 are arranged close to the second conductive region 210b near the second conductive region 210b to prevent a GIDL. Alternatively, both the first charge implanted region CIR1 and the second charge implanted region CIR2 may be arranged far from the second conductive region 210b.

The area of the first charge implanted region CIR1 may be less than the area of the first channel region 220c1. The area of the first charge implanted region CIR1 may be less than about a half (½) of the area of the first channel region 220c1. A width W1 of the first charge implanted region CIR1 may be less than a width W2 of the first channel region 220c1 or a width of the first gate electrode 230a. The width W1 of the first charge implanted region CIR1 may be less than about a half (½) of the width W2 of the first channel region 220c1.

The area of the second charge implanted region CIR2 may be less than the area of the second channel region 220c2. The area of the second charge implanted region CIR2 may be less than about a half (½) of the area of the second channel region 220c2. A width W3 of the second charge implanted region CIR2 may be less than a width W4 of the second channel region 220c2 or a width of the second gate electrode 230b. The width W3 of the second charge implanted region CIR2 may be less than about a half (½) of the width W4 of the second channel region 220c2.

In an embodiment, the width W2 of the first channel region 220c1 is a length between the first conductive region 210a and the second conductive region 210b in a moving direction of charges and may refer to a channel length L1 of the first channel region 220c1. In an embodiment of FIG. 3, the channel length L1 may be the length of the first gate electrode 230a in the x direction.

In an embodiment, the width W4 of the second channel region 220c2 is a length between the second conductive region 210b and the third conductive region 210d in a moving direction of charges and may refer to a channel length L2 of the second channel region 220c2. In an embodiment of FIG. 3, the channel length L2 may be the length of the second gate electrode 230b in the y direction.

In an embodiment, the width W1 of the first charge implanted region CIR1 and the width W3 of the second charge implanted region CIR2 may be measured in a direction parallel to the channel length L1 of the first channel region 220c1 and the channel length L2 of the second channel region 220c2, respectively.

The first gate electrode 230a and the second gate electrode 230b may be on the gate insulating layer 112. The first gate electrode 230a and the second gate electrode 230b may overlap at least a portion of the semiconductor layer 210. The first gate electrode 230a may be arranged to overlap the first channel region 220c1 of the semiconductor layer 210. The second gate electrode 230b may be arranged to overlap the second channel region 220c2 of the semiconductor layer 210. Each of the first gate electrode 230a and the second gate electrode 230b may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single layer structure or a multilayer structure, each layer including at least one selected from the above-described material.

In an embodiment, as illustrated in FIG. 4, the first gate electrode 230a and the second gate electrode 230b may be integrally formed with a line WL, through which a gate voltage is applied, as a single unitary unit. The line WL may extend in the x direction, and the first gate electrode 230a may protrude from the line WL in the y direction. In an embodiment, the second gate electrode 230b may be defined by a portion of the line WL. The first gate electrode 230a may be integrally formed with the second gate electrode 230b as a single unitary unit.

The interlayer insulating layer 115 may cover the first gate electrode 230a and the second gate electrode 230b, and may be on the gate insulating layer 112.

According to an embodiment, the first charge implanted region CIR1 and the second charge implanted region CIR2 may be provided in the gate insulating layer 112 to reduce a leakage current that may occur when the thin-film transistor TFT' is turned off.

FIGS. 3 and 4 illustrate an embodiment in which the first charge implanted region CIR1 and the second charge implanted region CIR2 are arranged adjacent to the second conductive region 210b, but the disclosure is not limited thereto.

Figure 5:
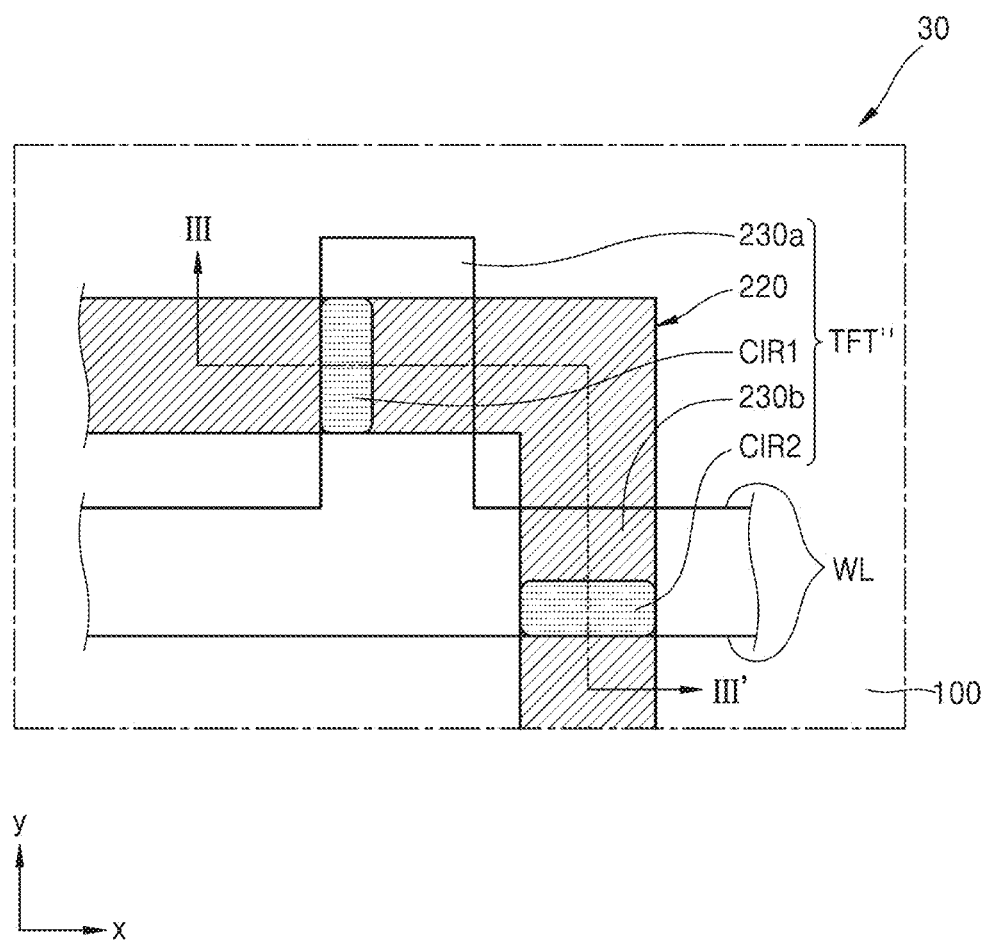
FIG. 5 is a plan view schematically illustrating a thin-film transistor substrate according to another alternative embodiment.
Figure 6:
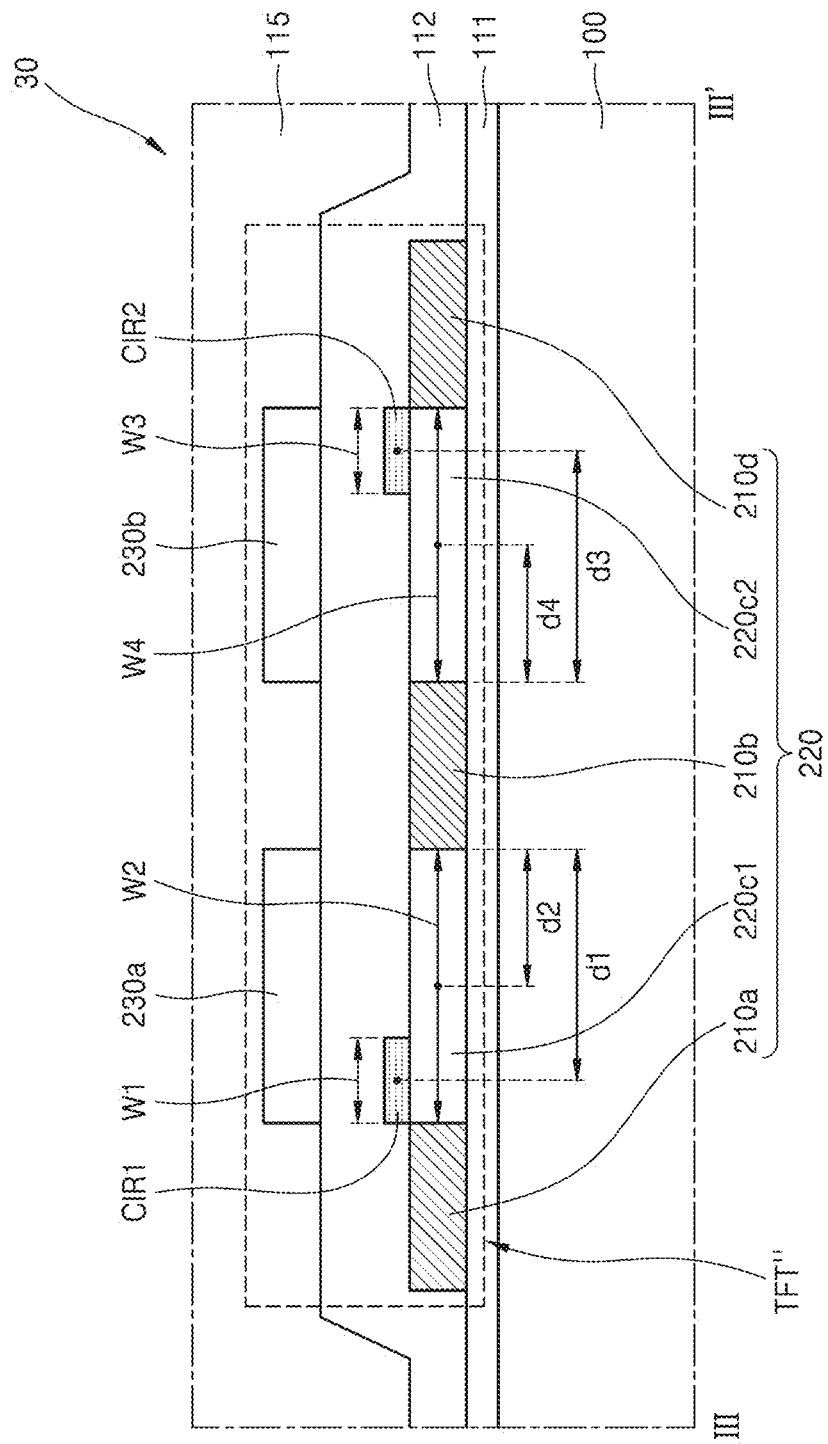
FIG. 6 is a cross-sectional view of the thin-film transistor substrate of FIG. 5 taken along line III-III'.

FIG. 5 is a plan view schematically illustrating a thin-film transistor substrate 30 according to another alternative embodiment, and FIG. 6 is a cross-sectional view of the thin-film transistor substrate 30 of FIG. 5 taken along line III-III'. In FIGS. 5 and 6, the same or like reference numerals as those in FIGS. 3 and 4 denote the same or like elements, and any repetitive detailed descriptions thereof will be omitted or simplified.

Referring to FIGS. 5 and 6, an embodiment of the thin-film transistor substrate 30 may include a substrate 100 and a thin-film transistor TFT" on the substrate 100.

The thin-film transistor TFT" includes a semiconductor layer 220, a gate insulating layer 112, and a first gate electrode 230a. The semiconductor layer 210 is on the substrate 100 and includes a first conductive region 210a, a second conductive region 210b, and a first channel region 220c1 between the first conductive region 210a and the second conductive region 210b. The gate insulating layer 112 is on the semiconductor layer 220 and includes a first charge implanted region CIR1 which partially overlaps (or overlaps a portion of) the first channel region 220c1 and into which charged ions are implanted. The first gate electrode 230a overlaps the first channel region 220c1 on the gate insulating layer 112.

In such an embodiment, the semiconductor layer 210 of the thin-film transistor TFT" may further include a second channel region 220c2 and a third conductive region 210d. The second channel region 220c2 may be between the second conductive region 210b and the third conductive region 210d. The second conductive region 210b may be between the first channel region 220c1 and the second channel region 210c2.

The gate insulating layer 112 may further include a second charge implanted region CIR2 which partially overlaps (or overlaps a portion of) the second channel region 220c2 and into which charged ions are implanted.

In an embodiment where the thin-film transistor TFT" is a P-type transistor, negatively charged ions may be implanted into the first charge implanted region CIR1 and the second charge implanted region CIR2. In an embodiment, the ions implanted into the first charge implanted region CIR1 and the second charge implanted region CIR2 may be $F^-$, $Cl^-$, $O^{2-}$, or $P^{3-}$. In an embodiment where the thin-film transistor TFT" is an N-type transistor, positively charged ions may be implanted into the first charge implanted region CIR1 and the second charge implanted region CIR2.

The concentration of the ions implanted into the first charge implanted region CIR1 and the second charge implanted region CIR2 may be less than the concentration of the dopant doped into the first conductive region 210a and the second conductive region 210b. In an embodiment, the concentration of the ions implanted into the charge implanted region CIR may be in a range of about 3E11 to about 3E12 (i.e., about $3 \times 10^{11}$ to about $3 \times 10^{12}$) ions/cm². In one alternative embodiments the concentration of the dopant doped into the first conductive region 210a and the second conductive region 210b may be about 1E15 (about $1 \times 10^{15}$) ions/cm².

In such an embodiment, the first charge implanted region CIR1 may be arranged adjacent to the first conductive region 210a, and the second charge implanted region CIR2 may be arranged adjacent to the third conductive region 210d. In such an embodiment, the first charge implanted region CIR1 may be arranged close to the first conductive region 210a, and the second charge implanted region CIR2 may be arranged close to the third conductive region 210d.

In such an embodiment, a distance d1 between the center of the first charge implanted region CIR1 and the second conductive region 210b may be greater than a distance d2 between the center of the first channel region 210c1 and the second conductive region 210b, and a distance d3 between the center of the second charge implanted region CIR2 and the second conductive region 210b may be greater than a distance d4 between the center of the second channel region 210c2 and the second conductive region 210b.

In such an embodiment, as described above, a GIDL of the thin-film transistor TFT" is effectively prevented.

The area of the first charge implanted region CIR1 may be less than the area of the first channel region 210c1. The area of the first charge implanted region CIR1 may be less than about a half (½) of the area of the first channel region 210c1. A width W1 of the first charge implanted region CIR1 may be less than a width W2 of the first channel region 210c1 or a width of the first gate electrode 230a. The width W1 of the first charge implanted region CIR1 may be less than about a half (½) of the width W2 of the first channel region 210c1.

The area of the second charge implanted region CIR2 may be less than the area of the second channel region 210c2. The area of the second charge implanted region CIR2 may be less than about a half (½) of the area of the second channel region 210c2. A width W3 of the second charge implanted region CIR2 may be less than a width W3 of the second channel region 210c2 or a width of the second gate electrode 230b. The width W3 of the second charge implanted region CIR2 may be less than about a half (½) of the width W4 of the second channel region 210c2.

According to an embodiment, the first charge implanted region CIR1 and the second charge implanted region CIR2 may be provided in the gate insulating layer 112 to reduce a leakage current that may occur when the thin-film transistor TFT" is turned off.

FIGS. 7A to 7D are schematic cross-sectional views illustrating a method of manufacturing a thin-film transistor substrate, according to an embodiment. Specifically, FIGS. 7A to 7D sequentially illustrate an embodiment of a method of manufacturing the thin-film transistor substrate 10 of FIG. 2.

Figure 7A:
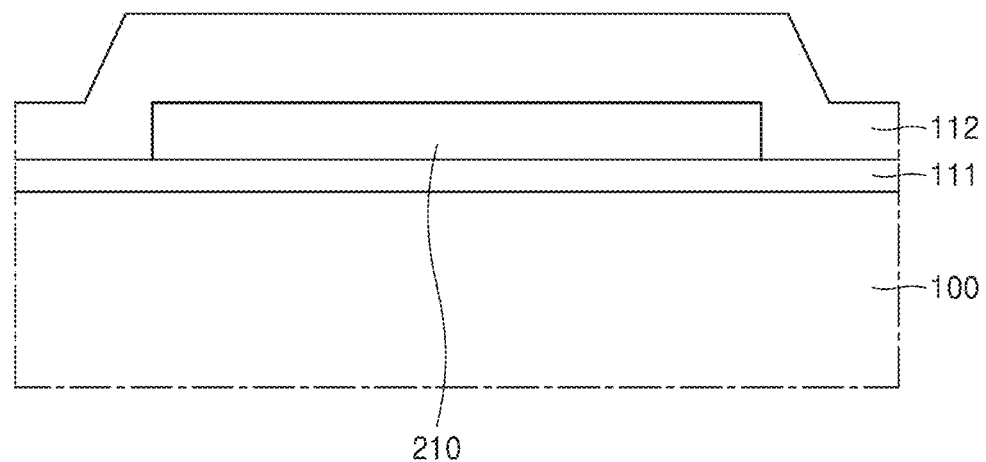
FIGS. 7A to 7D are schematic cross-sectional views illustrating a method of manufacturing a thin-film transistor substrate, according to embodiments.

Referring to FIG. 7A, in an embodiment of a method of manufacturing the thin-film transistor substrate 10, a buffer layer 111, a semiconductor layer 210, and a gate insulating layer 112 are provided or formed on a substrate 100.

The substrate 100 may include a glass material, a ceramic material, a metal material, or a flexible or bendable organic material.

First, the buffer layer 111 is provided or formed on the entire surface of the substrate 100. The buffer layer 111 may include an inorganic material such as silicon oxide ($SiO_2$), silicon nitride ($SiN_x$), and/or silicon oxynitride ($SiO_xN_y$), and may be deposited by a chemical vapor deposition ("CVD") or an atomic layer deposition ("ALD").

The semiconductor layer 210 is provided or formed on the buffer layer 111. In an embodiment, an amorphous silicon layer is deposited on the buffer layer 111 and then crystallized to form a polysilicon layer (not illustrated). The polysilicon layer may be formed by crystallizing the amorphous silicon layer by at least one selected from various methods such as rapid thermal annealing ("RTA"), solid phase crystallization ("SPC"), excimer laser annealing ("ELA"), metal induced crystallization ("MIC"), metal induced lateral crystallization ("MILC"), and sequential lateral solidification ("SLS"). The formed polysilicon layer may be patterned into the semiconductor layer 210 by a photolithography process using a mask (not illustrated).

According to an alternative embodiment, the amorphous silicon layer may be patterned and crystallized to form the semiconductor layer 210 including polysilicon.

A gate insulating layer 112 is provided or formed on the substrate 100 to cover the semiconductor layer 210. The gate insulating layer 112 may include an inorganic material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), and may be formed by a CVD or an ALD.

Figure 7B:
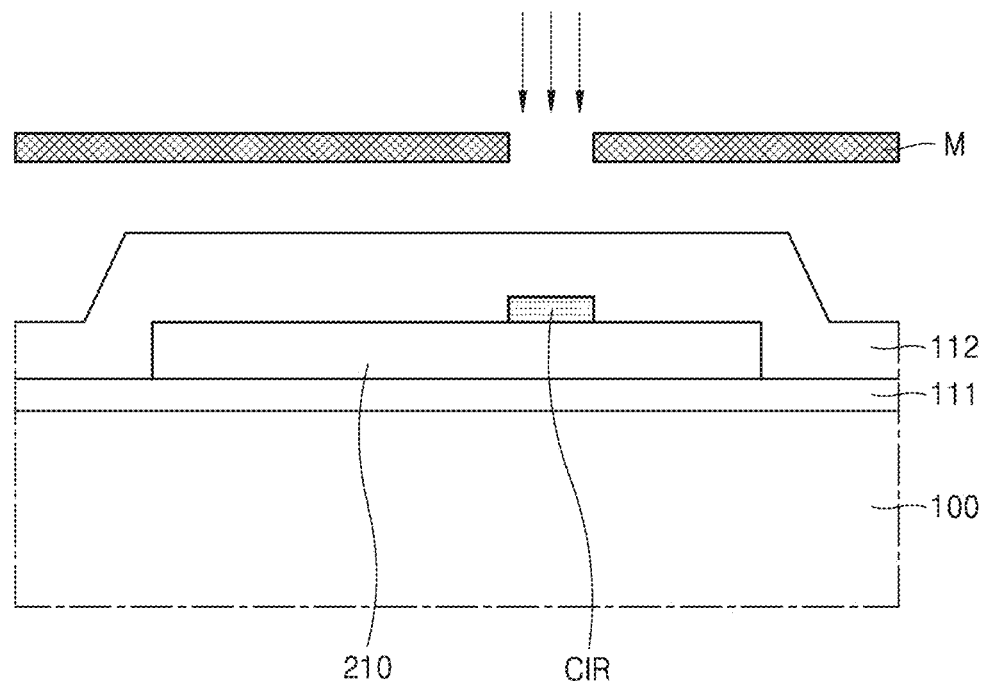

Referring to FIG. 7B, a charge implanted region CIR is provided or formed in the gate insulating layer 112. A hard mask M with an opening formed therein is arranged on an upper portion of the substrate 100 in which the charge implanted region CIR is to be formed, and then, ions are implanted thereinto.

In an embodiment where the thin-film transistor to be formed is a P-type transistor, negatively charged ions may be implanted into the charge implanted region CIR. In an embodiment, the ions implanted into the charge implanted region CIR may be $F^-$, $Cl^-$, $O^{2-}$, or $P^{3-}$. In an embodiment where the thin-film transistor to be formed is an N-type transistor, positively charged ions may be implanted into the charge implanted region CIR. The charge implanted region CIR may overlap a channel region 210c and may be arranged adjacent to a second conductive region 210b acting as a drain region. In such an embodiment, the center of the charge implanted region CIR may be arranged closer to the drain region than the center of the channel region 210c.

The ions may be implanted into the charge implanted region CIR with an ion energy in a range of about 5 kiloelectronvolts (keV) to about 10 keV and at an ion concentration in a range of about 3E11 to about 3E12 ions/cm².

In such an embodiment, the ion energy is lower than the energy of the dopant to be implanted into the first conductive region 210a and the second conductive region 210b. In an embodiment, the energy of the dopant implanted into the first conductive region 210a and the second conductive region 210b may be about 40 keV. Because the energy of the ions implanted into the charge implanted region CIR is set to be low, the ions may exist in the gate insulating layer 112 without reaching the semiconductor layer 210. A position and a height at which the charge implanted region CIR is formed may be adjusted by controlling the energy and implantation time of ions implanted into the charge implanted region CIR. In an embodiment, the height of the charge implanted region CIR may be less than the height of the gate insulating layer 112 as illustrated, but not being limited thereto. Alternatively, the height of the charge implanted region CIR may be the same as the height of the gate insulating layer 112.

In an embodiment, the ion concentration is lower than the concentration of the dopant implanted into the first conductive region 210a and the second conductive region 210b. The concentration of the dopant implanted into the first conductive region 210a and the second conductive region 210b may be about 1E15 ions/cm². The ion concentration may be determined based on the characteristics of the thin-film transistor.

Figure 7C:
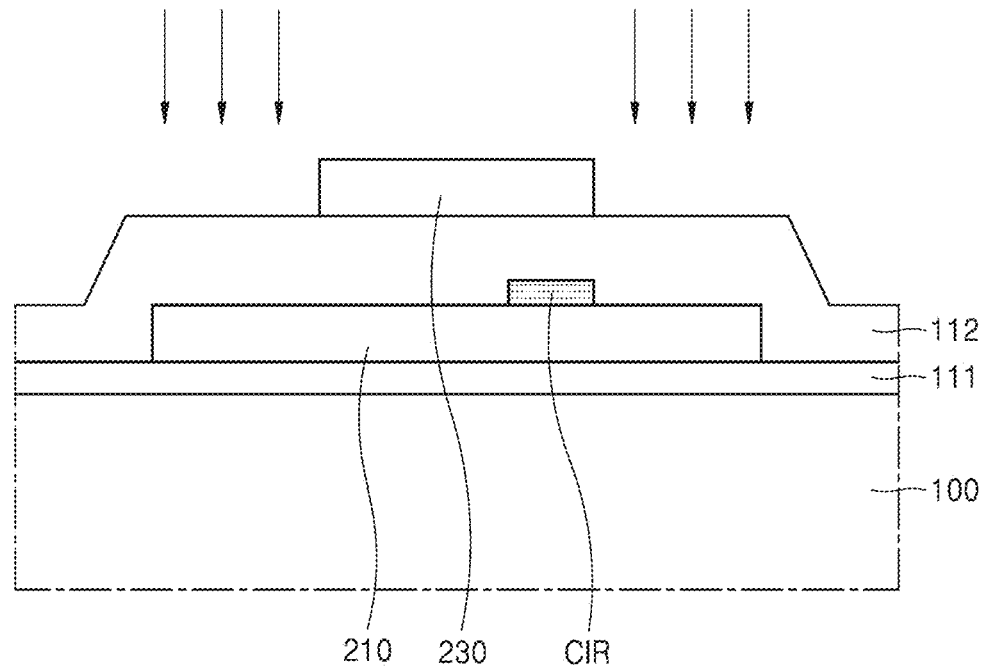

Referring to FIG. 7C, a gate electrode 230 is provided or formed on the gate insulating layer 112, and a doping process of implanting a dopant into the semiconductor layer 210 by using the gate electrode 230 as a mask is performed.

A metal layer such as molybdenum (Mo) and titanium (Ti) may be formed by a deposition process such as CVD, a plasma enhanced CVD ("PECVD"), a low pressure CVD ("LPCVD"), a physical vapor deposition ("PVD"), a sputtering, an ALD, or the like and then patterned to form the gate electrode 230.

A dopant is implanted into the semiconductor layer 210 by using the gate electrode 230 as a mask. Because the energy of the dopant is higher than the energy of the ions implanted into the charge implanted region CIR, the dopant may reach the semiconductor layer 210. In an embodiment, the energy of the dopant may be about 40 keV. In a case of forming a P-type transistor, a P-type dopant may be implanted, and in a case of forming an N-type transistor, an N-type dopant may be implanted. The concentration of the dopant may be about 1E15 ions/cm².

Figure 7D:
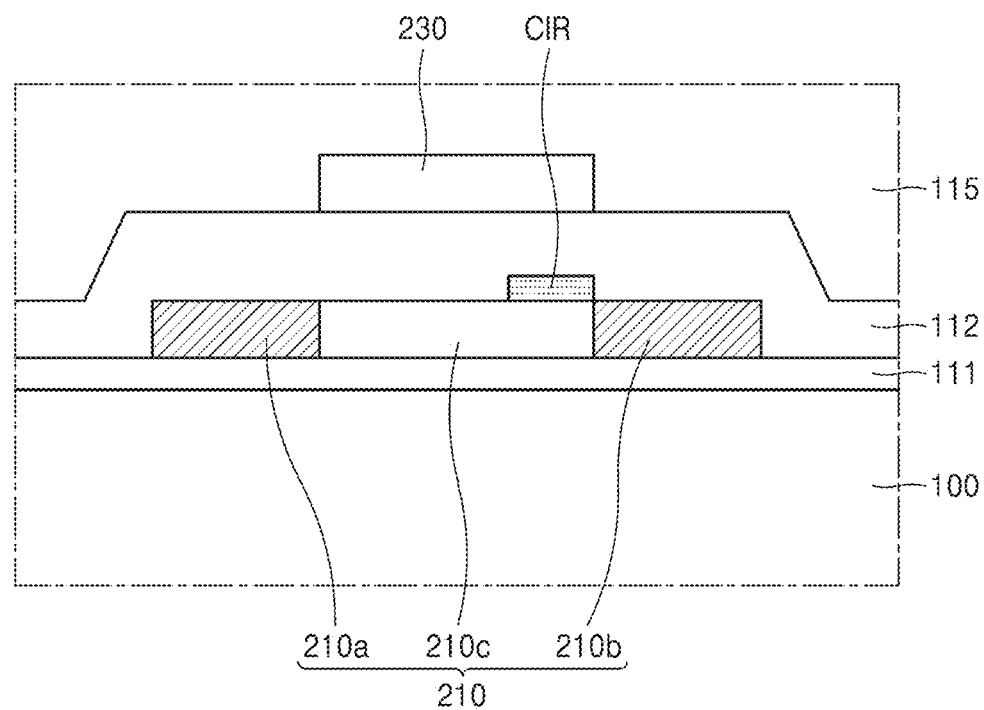

Through the doping process, a first conductive region 220a and a second conductive region 220b may be formed in the semiconductor layer 210, as illustrated in FIG. 7D. An interlayer insulating layer 115 may be provided or formed on the gate insulating layer 112 to cover the gate electrode 230. The interlayer insulating layer 115 may include an inorganic material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), and may be formed by a CVD or an ALD.

Figure 8:
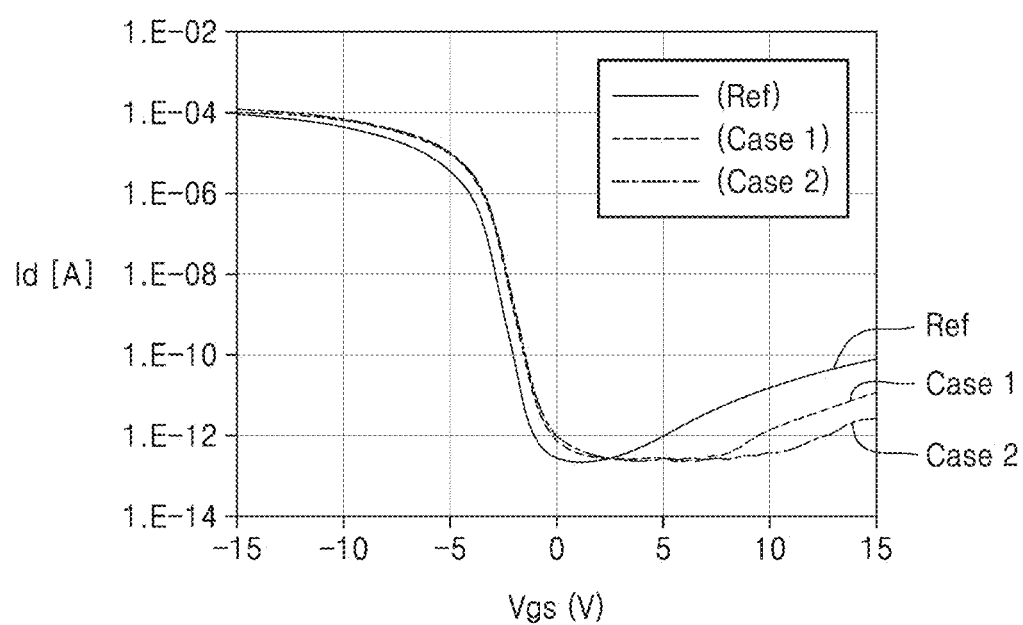
FIG. 8 is a simulation graph for comparing leakage currents before and after a charge implanted region is introduced.

FIG. 8 is a simulation graph for comparing leakage currents before and after the charge implanted region is introduced, and illustrates a graph of a drain current (Id) with respect to a gate-source voltage (Vgs) of the thin-film transistor.

In FIG. 8, (Ref) is a graph when no charge implanted region is introduced, and (Case1) is a graph when ions are implanted into the charge implanted region at a concentration of 1E12 ions/$cm^2$. In FIG. 8, (Case2) is a graph when ions are implanted into the charge implanted region at a concentration of 3E12 ions/$cm^2$.

Referring to FIG. 8, it is shown that the leakage currents in (Case1) and (Case2) in which the charge implanted region is present are alleviated, compared to (Ref) in which no charge implanted region is introduced.

It may be shown that the leakage current is reduced as the concentration of the ions implanted into the charge implanted region is higher (Case2). However, in case of implanting ions with a higher concentration than in (Case2), a threshold voltage (Vth) may shift further to the right. Therefore, in an embodiment of the invention, the ions may be implanted at a concentration in a range of about 3E11 to about 3E12 ions/$cm^2$.

Figure 9:
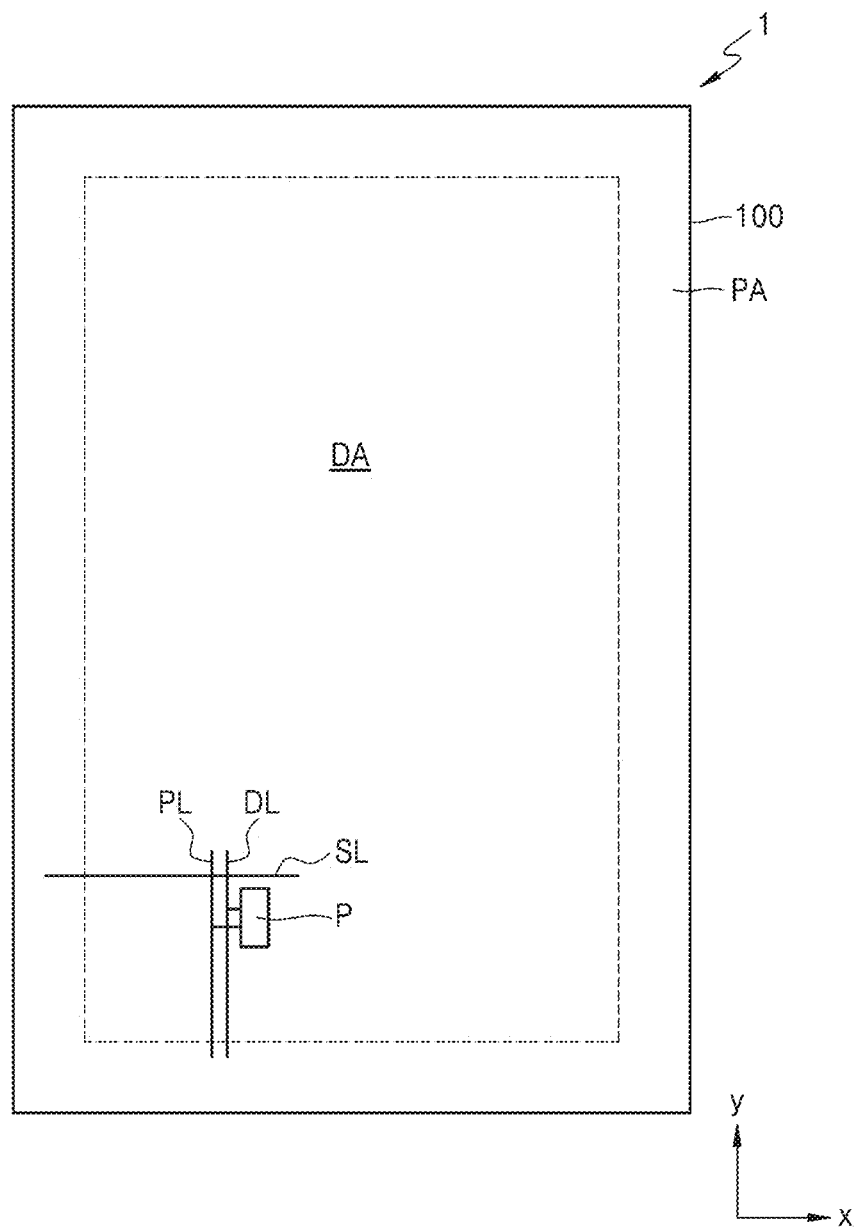
FIG. 9 is a plan view schematically illustrating a display apparatus according to an embodiment.

FIG. 9 is a plan view schematically illustrating a display apparatus 1 according to an embodiment.

Referring to FIG. 9, a substrate 100 of the display apparatus 1 may be divided into a display area DA and a peripheral area PA around the display area DA. The display apparatus 1 may provide a certain image by using light emitted from a plurality of pixels P in the display area DA.

Each of the pixels P may include a display element such as an organic light-emitting diode or an inorganic light-emitting diode, and may emit, for example, red light, green light, blue light, or white light. In such an embodiment, each of the pixels P may be connected to a pixel circuit including a thin-film transistor, a storage capacitor, and the like. The pixel circuit may be connected to a scan line SL, a data line DL crossing the scan line SL, and a driving voltage line PL. The scan line SL may extend in the x direction, and the data line DL and the driving voltage line PL may extend in the y direction.

The pixel circuit may be driven so that the pixel P emits light, and the display area DA provides a certain image through the light emitted from the pixel P. In an embodiment, the pixel P may be defined as an emission area configured to emit light of any one color among red, green, blue, and white.

The peripheral area PA is an area in which the pixels P are not arranged, and does not provide an image. Pads connected to a driver integrated circuit ("IC") or a printed circuit board including a built-in driving circuit configured to drive the pixels P, a power supply line, and a driving circuit, may be arranged in the peripheral area PA.

An embodiment of the display apparatus 1 may include an organic light-emitting display, an inorganic electroluminescence ("EL") display (inorganic light-emitting display), a quantum dot display, or the like. Hereinafter, for convenience of description, embodiments where the display apparatus is an organic light-emitting display will be described in detail, but the display apparatus according to the disclosure is not limited thereto, and features to be described later may be applied to other various types of display apparatus as described above.

Figure 10:
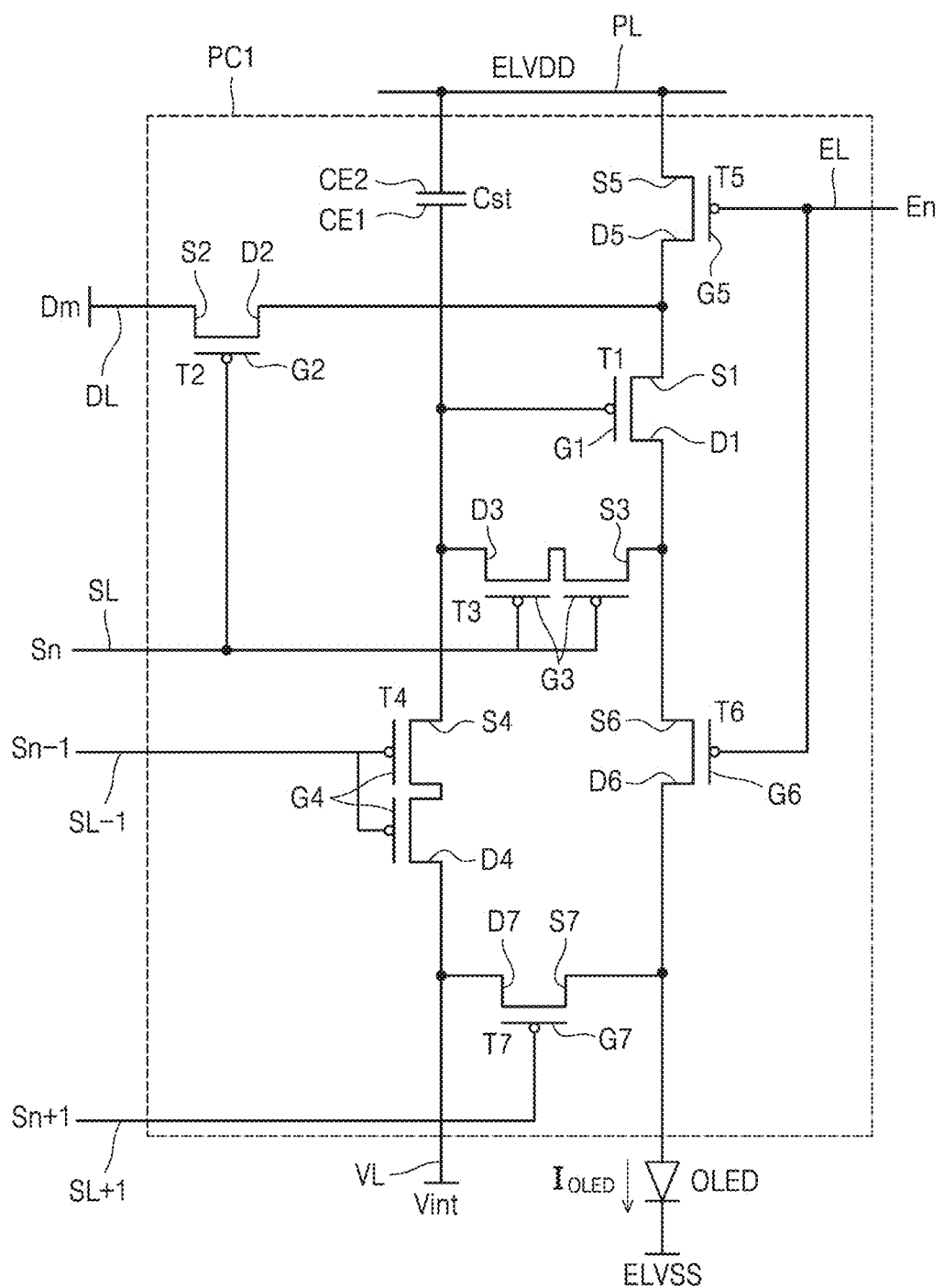
FIG. 10 is an equivalent circuit diagram illustrating a pixel circuit configured to drive a pixel and a display element connected thereto, according to an embodiment.

FIG. 10 is an equivalent circuit diagram illustrating a pixel circuit PC1 configured to drive a pixel and a display element connected thereto, according to an embodiment.

Referring to FIG. 10, an embodiment of the pixel circuit PC1 may include first to seventh thin-film transistors T1 to T7 and a capacitor Cst. The first to seventh thin-film transistors T1 to T7 and the capacitor Cst may be connected to first to third scan lines SL, SL−1, and SL+1 configured to transmit first to third scan signals Sn, Sn−1, and Sn+1, respectively, a data line DL configured to transmit a data voltage Dm, an emission control line EL configured to transmit an emission control signal En, a driving voltage line PL configured to transmit a driving voltage ELVDD, an initialization voltage line VL configured to transmit an initialization voltage Vint, and an opposite electrode to which a common voltage ELVSS is applied.

The first thin-film transistor T1 is a driving transistor in which a magnitude of a drain current is determined based on a gate-source voltage thereof, and the second to seventh thin-film transistors T2 to T7 may be switching transistors configured to be turned on/off based on gate-source voltages thereof, substantially gate voltages thereof.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

The capacitor Cst is connected between the driving voltage line PL and a driving gate G1 of the driving thin-film transistor T1. The capacitor Cst may include an upper electrode CE2 connected to the driving voltage line PL and a lower electrode CE1 connected to the driving gate G1 of the driving thin-film transistor T1.

The driving thin-film transistor T1 may control a magnitude of a driving current $I_{OLED}$ flowing from the driving voltage line PL to an organic light-emitting diode OLED based on the gate-source voltage thereof. The driving thin-film transistor T1 may include the driving gate G1 connected to the lower electrode CE1 of the capacitor Cst, a driving source S1 connected to the driving voltage line PL through the first emission control thin-film transistor T5, and a driving drain D1 connected to the organic light-emitting diode OLED through the second emission control thin-film transistor T6.

The driving thin-film transistor T1 may output the driving current $I_{OLED}$ to the organic light-emitting diode OLED based on the gate-source voltage thereof. The magnitude of the driving current $I_{OLED}$ is determined based on the difference between the gate-source voltage and a threshold voltage of the driving thin-film transistor T1. The organic light-emitting diode OLED may be configured to receive the driving current $I_{OLED}$ from the driving thin-film transistor T1 and emit light with a brightness corresponding to the magnitude of the driving current $I_{OLED}$.

The scan thin-film transistor T2 is configured to transmit the data voltage Dm to the driving source S1 of the driving thin-film transistor T1 in response to the first scan signal Sn. The scan thin-film transistor T2 may include a scan gate G2 connected to the first scan line SL, a scan source S2 connected to the data line DL, and a scan drain D2 connected to the driving source S1 of the driving thin-film transistor T1.

The compensation thin-film transistor T3 is connected in series between the driving drain D1 and the driving gate G1 of the driving thin-film transistor T1 and connects the driving drain D1 and the driving gate G1 of the driving thin-film transistor T1 to each other in response to the first scan signal Sn. The compensation thin-film transistor T3 may include a compensation gate G3 connected to the first scan line SL, a compensation source S3 connected to the driving drain D1 of the driving thin-film transistor T1, and a compensation drain D3 connected to the driving gate G1 of the driving thin-film transistor T1. FIG. 10 illustrates an embodiment where the compensation thin-film transistor T3 includes two thin-film transistors connected in series to each other, but not being limited thereto. Alternatively, the compensation thin-film transistor T3 may include a single thin-film transistor.

The gate initialization thin-film transistor T4 applies the initialization voltage Vint to the driving gate G1 of the driving thin-film transistor T1 in response to the second scan signal Sn−1. The gate initialization thin-film transistor T4 may include a first initialization gate G4 connected to the second scan line SL−1, a first initialization source S4 connected to the driving gate G1 of the driving thin-film transistor T1, and a first initialization drain D4 connected to the initialization voltage line VL. FIG. 10 illustrates an embodiment where the gate initialization thin-film transistor T4 includes two thin-film transistors connected in series to each other, but not being limited thereto. Alternatively, the gate initialization thin-film transistor T4 may include a single thin-film transistor.

The anode initialization thin-film transistor T7 applies the initialization voltage Vint to the anode of the organic light-emitting diode OLED in response to the third scan signal Sn+1. The anode initialization thin-film transistor T7 may include a second initialization gate G7 connected to the third scan line SL+1, a second initialization source S7 connected to the anode of the organic light-emitting diode OLED, and a second initialization drain D7 connected to the initialization voltage line VL.

The first emission control thin-film transistor T5 may connect the driving voltage line PL to the driving source S1 of the driving thin-film transistor T1 in response to the emission control signal En. The first emission control thin-film transistor T5 may include a first emission control gate G5 connected to the emission control line EL, a first emission control source S5 connected to the driving voltage line PL, and a first emission control drain D5 connected to the driving source S1 of the driving thin-film transistor T1.

The second emission control thin-film transistor T6 may connect the driving drain D1 of the driving thin-film transistor T1 to the anode of the organic light-emitting diode OLED in response to the emission control signal En. The second emission control thin-film transistor T6 may include a second emission control gate G6 connected to the emission control line EL, a second emission control source S6 connected to the driving drain D1 of the driving thin-film transistor T1, and a second emission control drain D6 connected to the anode of the organic light-emitting diode OLED.

The second scan signal Sn−1 may be substantially synchronized with a first scan signal Sn of a previous row. The third scan signal Sn+1 may be substantially synchronized with the first scan signal Sn. According to an alternative embodiment, the third scan signal Sn+1 may be substantially synchronized with a first scan signal Sn of a next row.

In an embodiment, the first to seventh thin-film transistors T1 to T7 may include a semiconductor layer including silicon. In one embodiment, for example, the first to seventh thin-film transistors T1 to T7 may include a semiconductor layer including low temperature polysilicon ("LTPS").

In an alternative embodiment, some semiconductor layers of the first to seventh thin-film transistors T1 to T7 may include LTPS, and other semiconductor layers thereof may include an oxide semiconductor. The oxide semiconductor may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In one embodiment, for example, the oxide semiconductor may include an InSnZnO ("ITZO") semiconductor, an InGaZnO ("IGZO") semiconductor, or the like.

Hereinafter, a detailed operation of one pixel of the display apparatus 1, according to an embodiment, will be described in detail. In such an embodiment, as illustrated in FIG. 10, the first to seventh thin-film transistors T1 to T7 are P-type metal-oxide semiconductor field effect transistors ("MOSFETs").

When the high-level emission control signal En is received, the first emission control thin-film transistor T5 and the second emission control thin-film transistor T6 are turned off, the driving thin-film transistor T1 stops outputting the driving current $I_{OLED}$, and the organic light-emitting diode OLED stops emitting light.

During a gate initialization period in which the low-level second scan signal Sn−1 is received, the gate initialization thin-film transistor T4 is turned on and the initialization voltage Vint is applied to the driving gate G1 of the driving thin-film transistor T1, that is, the lower electrode CE1 of the capacitor Cst. The difference (ELVDD−Vint) between the driving voltage ELVDD and the initialization voltage Vint is stored in the capacitor Cst.

During a data write period in which the low-level first scan signal Sn is received, the scan thin-film transistor T2 and the compensation thin-film transistor T3 are turned on and the data voltage Dm is applied to the driving source S1 of the driving thin-film transistor T1. The driving thin-film transistor T1 is diode-connected by the compensation thin-film transistor T3 and is thus forward biased. The gate voltage of the driving thin-film transistor T1 increases from the initialization voltage Vint. When the gate voltage of the driving thin-film transistor T1 is equal to a data compensation voltage (Dm−|Vth|) obtained by subtracting the threshold voltage (Vth) of the driving thin-film transistor T1 from the data voltage Dm, the driving thin-film transistor T1 is turned off and the increase in the gate voltage of the driving thin-film transistor T1 is stopped. Therefore, the difference (ELVDD−Dm+|Vth|) between the driving voltage ELVDD and the data compensation voltage (Dm−|Vth|) is stored in the capacitor Cst.

Also, during an anode initialization period in which the low-level third scan signal Sn+1 is received, the anode initialization thin-film transistor T7 is turned on and the initialization voltage Vint is applied to the anode of the organic light-emitting diode OLED. The organic light-emitting diode OLED is completely turned off by applying the initialization voltage Vint to the anode of the organic light-emitting diode OLED. Although the pixel PX receives a data voltage Dm corresponding to a black gray scale in a next frame, a phenomenon in which the organic light-emitting diode OLED slightly emits light may be effectively prevented.

In an embodiment, the first scan signal Sn and the third scan signal Sn+1 may be substantially synchronized with each other. In such an embodiment, the data write period and the anode initialization period may be a same period.

When the low-level emission control signal En is received, the first emission control thin-film transistor T5 and the second emission control thin-film transistor T6 may be turned on, the driving thin-film transistor T1 may output the voltage stored in the capacitor Cst, that is, the driving current $I_{OLED}$ corresponding to the voltage (ELVDD−Dm) obtained by subtracting the threshold voltage (|Vth|) of the driving thin-film transistor T1 from the source-gate voltage (ELVDD−Dm+|Vth|) of the driving thin-film transistor T1, and the organic light-emitting diode OLED may emit light with a luminance corresponding to the magnitude of the driving current $I_{OLED}$.

When the scan signal of the turn-off level (high level) is applied to the gates G3 and G4 of the third and fourth thin-film transistors T3 and T4 in the pixel circuit PC1 of FIG. 10, no or very small current is desired to flow through the third and fourth thin-film transistors T3 and T4.

However, a leakage current may occur through the third and fourth thin-film transistors T3 and T4 to be turned off during the emission period of the organic light-emitting diode OLED. When a leakage current occurs in the third and fourth thin-film transistor T3 and T4, information about the image frame may not be maintained, thus causing image deterioration or flicker.

Therefore, in an embodiment, the third and fourth thin-film transistors T3 and T4 in the pixel circuit PC1 of FIG. 10 are provided with an embodiment of the thin-film transistor TFT, TFT', or TFT" described above with reference to FIGS. 1 to 6, and thus, a leakage current may be minimized. Embodiments of the thin-film transistor TFT, TFT', and TFT" described above with reference to FIGS. 1 to 6 may be applied to thin-film transistors other than the third and fourth thin-film transistors T3 and T4.

Figure 11:
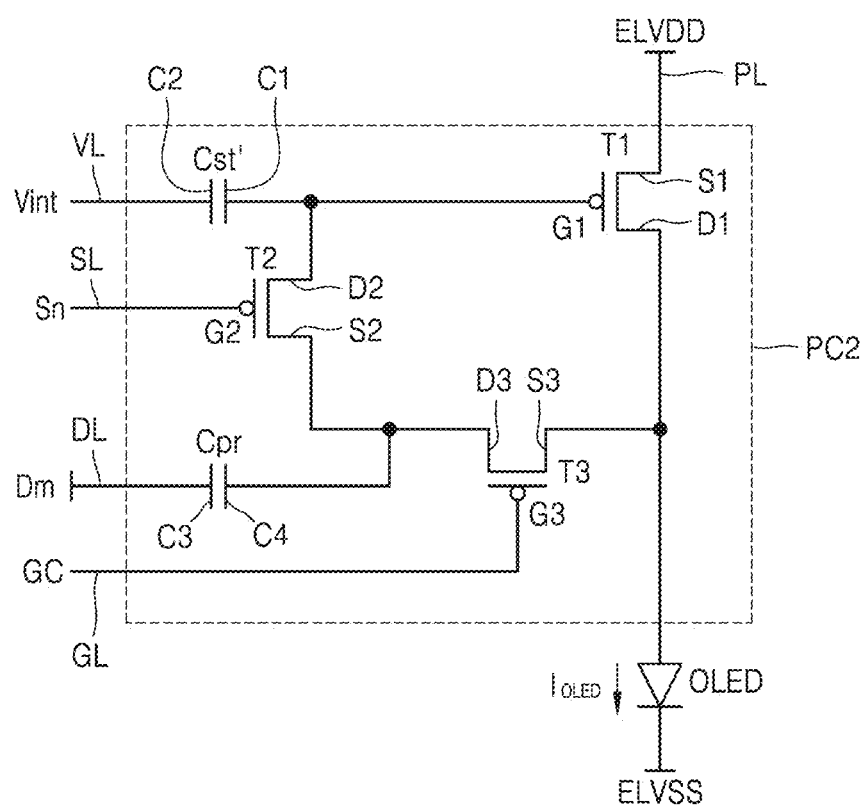
FIG. 11 is an equivalent circuit diagram illustrating a pixel circuit configured to drive a pixel and a display element connected thereto, according to an alternative embodiment.

FIG. 11 is an equivalent circuit diagram illustrating a pixel circuit PC2 configured to drive a pixel and a display element connected thereto, according to an alternative embodiment.

Referring to FIG. 11, an embodiment of the pixel circuit PC2 may include first to third thin-film transistors T1 to T3, a first capacitor Cst', and a second capacitor Cpr. The first to third thin-film transistors T1 to T3 and the first and second capacitors Cst' and Cpr may be connected to a scan line SL configured to transmit a scan signal Sn, a compensation control line GL configured to transmit a compensation control signal GC, a data line DL configured to transmit a data voltage Dm, a driving voltage line PL configured to transmit a driving voltage ELVDD, an initialization voltage line VL configured to transmit an initialization voltage Vint, and an opposite electrode to which a common voltage ELVSS is applied.

The first thin-film transistor T1 may be referred to as a driving thin-film transistor, the second thin-film transistor T2 may be referred to as a switching thin-film transistor, and the third thin-film transistor T3 may be referred to as a compensation thin-film transistor.

A driving gate G1 of the driving thin-film transistor T1 is connected to a first electrode C1 of the first capacitor Cst', a driving source S1 of the driving thin-film transistor T1 is connected to the driving voltage line PL, and a driving drain D1 of the driving thin-film transistor T1 is electrically connected to a pixel electrode of an organic light-emitting diode OLED. The driving thin-film transistor T1 is configured to receive the data signal Dm based on the switching operation of the switching thin-film transistor T2 and supply a driving current $I_{OLED}$ to the organic light-emitting diode OLED.

A switching gate G2 of the switching thin-film transistor T2 is connected to the scan line SL, a switching source S2 of the switching thin-film transistor T2 is connected to the data line DL via the second capacitor Cpr including the third electrode C3 and a fourth electrode C4, and a switching drain D2 of the switching thin-film transistor T2 is connected to the driving gate G1 of the driving thin-film transistor T1. The switching thin-film transistor T2 is configured to be turned on in response to the scan signal Sn received through the scan line SL and perform a switching operation of transmitting, to the driving thin-film transistor T1, the data signal Dm transmitted to the data line DL.

A compensation gate G3 of the compensation thin-film transistor T3 is connected to the compensation control line GL, a compensation source S3 of the compensation thin-film transistor T3 is connected to the pixel electrode of the organic light-emitting diode OLED, and a compensation drain S3 of the compensation thin-film transistor T3 is connected to the data line DL via the switching source S2 of the switching thin-film transistor T2 and the second capacitor Cpr. The compensation thin-film transistor T3 is turned on in response to the compensation control signal GC applied to the compensation gate G3.

The first capacitor Cst' is connected between the driving gate G1 of the driving thin-film transistor T1 and the initialization voltage line VL configured to supply the initialization voltage Vint and acts as a storage capacitor, and the second capacitor Cpr is connected between the switching source S2 of the switching thin-film transistor T2 and the data line DL configured to supply the data signal Dm and acts as a programming capacitor.

The data signal Dm applied to the second capacitor Cpr is applied to the first capacitor Cst' by the operation of the switching thin-film transistor T2, the driving gate voltage applied to the driving gate G1 of the driving thin-film transistor T1 is determined, and the driving thin-film transistor T1 is turned on by the driving gate voltage. Therefore, the organic light-emitting diode OLED is configured to receive the driving current $I_{OLED}$ from the driving thin-film transistor T1 and emit light to display an image.

If a leakage current occurs in the second thin-film transistor T2 during an emission period in the pixel circuit PC2 of FIG. 11, information about the image frame may not be maintained, thus causing image deterioration or flicker.

In general, an aging process of applying a stress to the thin-film transistor in advance in a process of manufacturing the thin-film transistor may be used to reduce or prevent the leakage current of the thin-film transistor. Specifically, the aging process may be performed by applying a high bias voltage between the gate and the drain of the thin-film transistor. In the case of the second thin-film transistor T2 in the pixel circuit PC1 of FIG. 11, the switching drain D2 is connected to the first capacitor Cst', and thus, it may be difficult to apply the bias voltage between the gate and the drain. Therefore, the aging process may not be effectively performed.

In an embodiment of the invention, the second thin-film transistor T2 in the pixel circuit PC2 of FIG. 11 is provided with an embodiment of the thin-film transistor TFT, TFT', or TFT" described above with reference to FIGS. 1 to 6, and thus, a leakage current may be minimized. Embodiments of the thin-film transistor TFT, TFT', and TFT" described above with reference to FIGS. 1 to 6 may be applied to thin-film transistors other than the second thin-film transistor T2.

Figure 12:
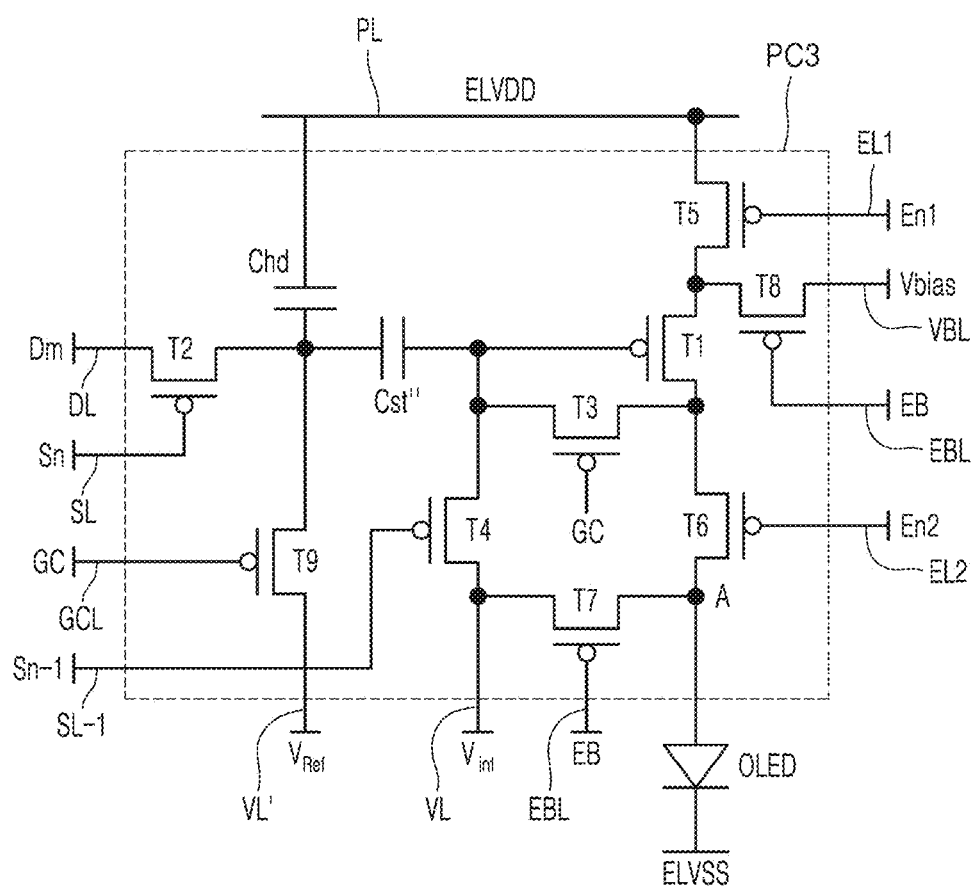
FIG. 12 is an equivalent circuit diagram illustrating a pixel circuit configured to drive a pixel and a display element connected thereto, according to another alternative embodiment.

FIG. 12 is an equivalent circuit diagram illustrating a pixel circuit PC3 configured to drive a pixel and a display element connected thereto, according to another alternative embodiment.

Referring to FIG. 12, an embodiment of the pixel circuit PC3 may include first to ninth thin-film transistors T1 to T9 and first and second capacitors Cst" and Chd. The first to ninth thin-film transistors T1 to T9 and the first and second capacitors Cst" and Chd may be connected to first and second scan lines SL and SL−1 configured to transmit first and second scan signals Sn and Sn−1, respectively, a data line DL configured to transmit a data voltage Dm, first and second emission control lines EL1 and EL2 configured to transmit first and second emission control signals En1 and En2, a compensation control line GCL configured to transmit a compensation control signal GC, a reference voltage line VL' configured to transmit a reference voltage Vref, a bias control line EBL configured to transmit a bias control signal EB, a bias line VBL configured to transmit a bias voltage Vbias, a driving voltage line PL configured to transmit a driving voltage ELVDD, an initialization voltage line VL configured to transmit an initialization voltage Vint, and an opposite electrode to which a common voltage ELVSS is applied.

The first thin-film transistor T1 is a driving transistor in which a magnitude of a drain current is determined based on a gate-source voltage thereof, and the second to ninth thin-film transistors T2 to T9 may be switching transistors configured to be turned on/off based on gate-source voltages thereof, substantially gate voltages thereof.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, the seventh thin-film transistor T7 may be referred to as an anode initialization thin-film transistor, the eighth thin-film transistor T8 may be referred to as a bias thin-film transistor, and the ninth thin-film transistor T9 may be referred to as a reference thin-film transistor.

In such an embodiment, the operations or functions of the first to seventh thin-film transistors T1 to T7 are similar to those of the first to seventh thin-film transistors T1 to T7 in the pixel circuit PC1 described above with reference to FIG. 10, any repetitive detailed descriptions thereof will be omitted.

A gate of the bias thin-film transistor T8 is connected to the bias control line EBL, and a source of the bias thin-film transistor T8 is connected to the bias line VBL. The bias thin-film transistor T8 is configured to be turned on in response to the bias control signal EB received through the bias control line EBL and apply the bias voltage Vbias to the source of the driving thin-film transistor T1. In this manner, the driving current between the source and the drain of the driving thin-film transistor T1 may be controlled.

A gate of the reference thin-film transistor T9 is connected to the compensation control line GCL, and a source of the reference thin-film transistor T9 is connected to the reference voltage line VL'. The reference thin-film transistor T9 may be configured to be turned on in response to the compensation control signal GC received through the compensation control line GCL and apply the reference voltage Vref to one electrode of the second capacitor Chd.

The second capacitor Chd is connected between the driving voltage line PL and the reference thin-film transistor T9 and stores a voltage corresponding to a potential difference between the driving voltage ELVDD and the reference voltage Vref transmitted when the reference thin-film transistor T9 is turned on.

The first capacitor Cst" is connected between the driving gate of the driving thin-film transistor T1 and the drain of the switching thin-film transistor T2.

In an embodiment of the pixel circuit PC3 of FIG. 12, if a leakage current occurs in the first to ninth thin-film transistor T1 to T9, image deterioration or flicker may occur. In such an embodiment, it may be difficult to perform the aging process on the thin-film transistors connected to the first and second capacitors Cst" and Chd.

Therefore, in such an embodiment, the second, third, fourth, and ninth thin-film transistor T2, T3, T4, and T9 are provided with an embodiment of the thin-film transistor TFT, TFT', or TFT" described above with reference to FIGS. 1 to 6, and thus, a leakage current may be minimized. In such an embodiment, embodiments of the thin-film transistor TFT, TFT', and TFT" described above with reference to FIGS. 1 to 6 may be applied to other thin-film transistors.

Figure 13:
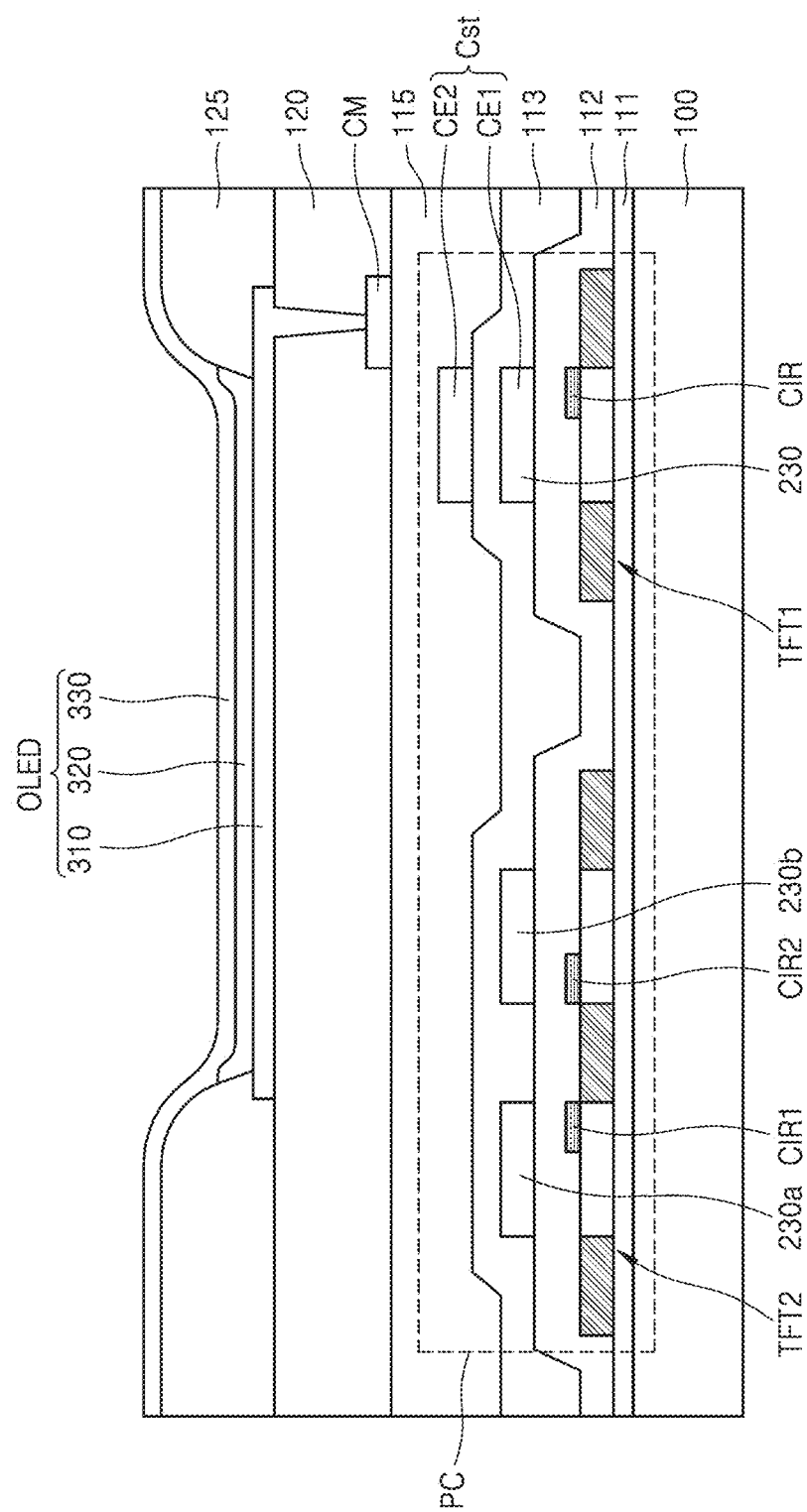
FIG. 13 is a cross-sectional view schematically illustrating a display apparatus according to an embodiment.

FIG. 13 is a cross-sectional view schematically illustrating a display apparatus according to an alternative embodiment. In FIG. 13, the same or like reference numerals as those in FIG. 2 denote the same or like elements, and any repetitive detailed descriptions thereof will be omitted or simplified.

Referring to FIG. 13, an embodiment of the display apparatus includes a substrate 100, a pixel circuit PC on the substrate 100, and an organic light-emitting diode OLED electrically connected to the pixel circuit PC. The pixel circuit PC may include a first thin-film transistor TFT1, a second thin-film transistor TFT2, and a capacitor Cst. In such an embodiment, the pixel circuits PC1 to PC3 described with reference to FIGS. 11 and 12 or various pixel circuits applicable to the display apparatus may be applied as the pixel circuit PC.

The first thin-film transistor TFT1 may be the thin-film transistor TFT described with reference to FIG. 2, or may be a driving thin-film transistor. The second thin-film transistor TFT2 may be the thin-film transistor TFT' described with reference to FIG. 4, or may be a switching thin-film transistor having a dual gate structure.

A charge implanted region CIR of the first thin-film transistor TFT1 may overlap a channel region of a semiconductor layer and may be arranged close to a drain region. In the second thin-film transistor TFT2, a first charge implanted region CIR1 and a second charge implanted region CIR2 may be arranged close to a conductive region between a first channel region and a second channel region.

An insulating layer 113 may be on a gate electrode 230 of the first thin-film transistor TFT1 and a gate electrode of the second thin-film transistor TFT2. The insulating layer 113 may include an inorganic insulating material such as silicon oxide ($SiO_2$), silicon nitride ($SiN_x$), silicon oxynitride ($Si O_x N_y$), aluminum oxide ($A_{l2}O_3$), or titanium oxide ($TiO_2$). The insulating layer 113 may have a single layer structure or a multilayer structure, each layer including at least one selected from the above-described inorganic insulating material.

The capacitor Cst may overlap the gate electrode 230 of the first thin-film transistor TFT1. The capacitor Cst includes a lower electrode CE1 and an upper electrode CE2. The insulating layer 113 may be between the lower electrode CE1 and the upper electrode CE2. In an embodiment, the gate electrode 230 may function not only as the gate electrode of the first thin-film transistor TFT1 but also as the lower electrode CE1 of the capacitor Cst. In such an embodiment, the gate electrode 230 may be provided as a single unitary unit with the lower electrode CE1. The upper electrode CE2 is on the insulating layer 113 and overlaps at least a portion of the lower electrode CE1.

Each of the lower electrode CE1 and the upper electrode CE2 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single layer structure or a multilayer structure, each layer including at least one selected from the above-described material.

The interlayer insulating layer 115 may cover the upper electrode CE2. A conductive layer CM may be on the interlayer insulating layer 115. The conductive layer CM may be a connection electrode that electrically connects one electrode of the transistors of the pixel circuit PC to the pixel electrode 310.

An organic insulating layer 120 may cover the conductive layer CM and may be on the interlayer insulating layer 115. The organic insulating layer 120 may have a single layer structure or a multilayer structure.

The organic insulating layer 120 may include a general-purpose polymer (e.g., photosensitive polyimide, polyimide, polystyrene ("PS"), polycarbonate, benzocyclobutene ("BCB"), hexamethyldisiloxane ("HMDSO"), polymethylmethacrylate ("PMMA"), etc.), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

Alternatively, the organic insulating layer 120 may include a siloxane-based organic material. The siloxane-based organic material may include hexamethyldisiloxane, octamethyltrisiloxane, decamethyltetrasiloxane, dodecamethylpentasiloxane, and polydimethylsiloxanes. The organic insulating layer 120 may act as a protective layer covering the thin-film transistors.

An organic light-emitting diode OLED including a pixel electrode 310, an opposite electrode 330, and an intermediate layer 320 therebetween and including an emission layer may be disposed on the organic insulating layer 120.

The pixel electrode 310 may be electrically connected to the conductive layer CM through a contact hole defined in the organic insulating layer 120, and may be connected to the thin-film transistors included in the pixel circuit PC through the conductive layer CM. The pixel electrode 310 may be directly connected to the first thin-film transistor TFT1, or may be indirectly connected to the first thin-film transistor TFT1 via another thin-film transistor (not illustrated) having an emission control function.

The pixel electrode 310 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). The pixel electrode 310 may include a reflective layer including silver (Ag), magnesium (Mg), aluminum (Al), or any compound thereof. In an embodiment, the pixel electrode 310 may have a structure including layers including ITO, IZO, ZnO, or $In_2O_3$ above and/or below the reflective layer. In one embodiment, for example, the pixel electrode 310 may have a structure in which ITO/Ag/ITO are stacked.

A pixel defining layer 125 may be on the organic insulating layer 120. The pixel defining layer 125 covers the edge of the pixel electrode 310 and has an opening through which the central portion of the pixel electrode 310 is exposed, thereby defining a pixel. In addition, the pixel defining layer 125 may prevent an electric arc or the like from occurring on the edge of the pixel electrode 310 by increasing the distance between the edge of the pixel electrode 310 and the opposite electrode 330 on the pixel electrode 310. The pixel defining layer 125 may be formed through a spin coating or the like by using an organic insulating material such as polyimide, polyamide, acrylic resin, benzocyclobutene, HMDSO, and phenol resin.

The intermediate layer 320 of the organic light-emitting diode OLED may include a low molecular weight material or a high molecular weight material, and may emit red light, green light, blue light, or white light. In an embodiment where the intermediate layer 320 includes a low molecular weight material, the intermediate layer 320 may have a structure in which a hole injection layer ("HIL"), a hole transport layer ("HTL"), an emission layer ("EML"), an electron transport layer ("ETL"), an electron injection layer ("EIL"), and the like are stacked in a single or complex structure, and may include various organic materials including copper phthalocyanine ("CuPc"), N,N-di(naphthalene-1-yl)-N,N'-diphenyl-benzidine ("NPB"), and tris-8-hydroxyquinoline aluminum ("Alq3"). Such layers may be formed by a vacuum deposition.

In an embodiment, where the intermediate layer 320 includes a high molecular weight material, the intermediate layer 320 may have a structure including an HTL and an EML. In such an embodiment, the HTL may include poly (3,4-ethylenedioxythiophene) ("PEDOT"), and the emission layer may include a polymer material such as poly-phenylenevinylene ("PPV") and polyfluorene. The intermediate layer 320 may be formed by a screen printing, an inkjet printing, or a laser induced thermal imaging ("LITI").

However, the intermediate layer 320 is not limited thereto, and may have other various structures. The intermediate layer 320 may include an integral layer over the pixel electrodes 310 or a layer patterned to correspond to the pixel electrodes 310.

The opposite electrode 330 is on the intermediate layer 320. The opposite electrode 330 may include a conductive material having a low work function. In one embodiment, for example, the opposite electrode 330 may include a (semi)transparent layer including silver (Ag), magnesium (Mg), aluminum (Al), platinum (Pt), lithium (Li), calcium (Ca), or any alloy thereof. Alternatively, the opposite electrode 330 may further include a layer such as ITO, IZO, ZnO, or $In_2O_3$ on the (semi)transparent layer including the above-described material. The opposite electrode 330 may be integral in the organic light-emitting diodes OLED to correspond to the pixel electrodes 310.

Figure 14:
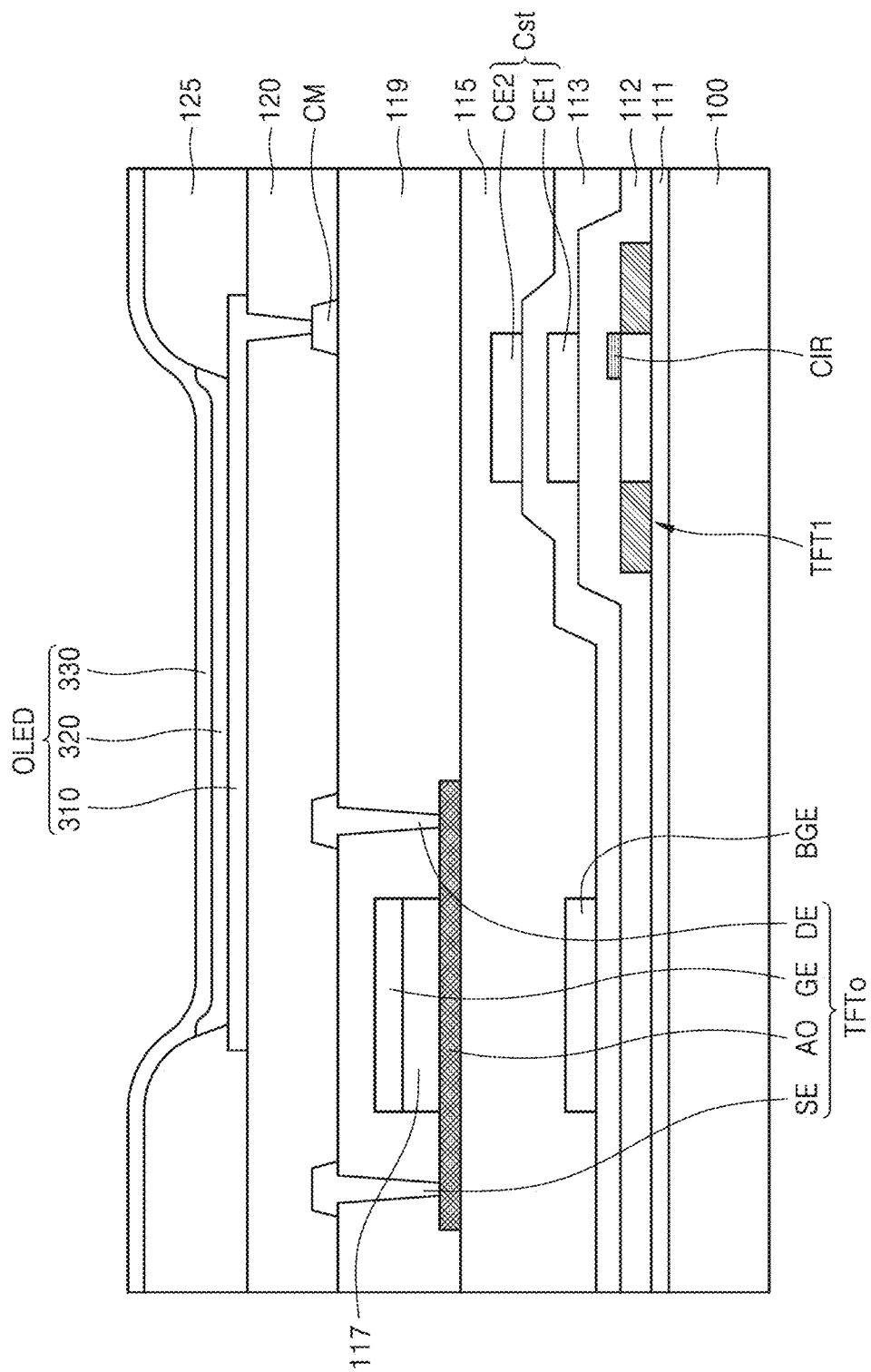
FIG. 14 is a cross-sectional view schematically illustrating a display apparatus according to an alternative embodiment.

FIG. 14 is a cross-sectional view schematically illustrating a display apparatus according to another alternative embodiment. In FIG. 14, the same or like reference numerals as those in FIG. 13 denote the same or like elements, and any repetitive detailed descriptions thereof will be omitted or simplified.

Referring to FIG. 14, an embodiment of the display apparatus includes a substrate 100, a pixel circuit PC on the substrate 100, and an organic light-emitting diode OLED electrically connected to the pixel circuit PC. The pixel circuit PC may include a first thin-film transistor TFT1, an oxide thin-film transistor TFTo, and a capacitor Cst. In such an embodiment, the pixel circuits PC1 to PC3 described above with reference to FIGS. 11 and 12 or various pixel circuits applicable to the display apparatus may be applied as the pixel circuit PC.

The first thin-film transistor TFT1 may be the thin-film transistor TFT described with reference to FIG. 2, may include a silicon semiconductor, and may be a driving thin-film transistor. The oxide thin-film transistor TFTo is a thin-film transistor using an oxide semiconductor and may be a switching thin-film transistor.

The oxide thin-film transistor TFTo may be on the interlayer insulating layer 115. The oxide thin-film transistor TFTo may include an oxide semiconductor layer AO, a gate electrode GE, a source electrode SE, and a drain electrode DE. In an embodiment, a lower electrode BGE may be disposed below the oxide thin-film transistor TFTo to overlap the gate electrode GE.

The oxide semiconductor layer AO may be on the interlayer insulating layer 115. The oxide semiconductor layer AO may include a channel region, and a source region and a drain region on both sides of the channel region. The oxide semiconductor layer AO may include an oxide of at least one material selected from indium (In), gallium (Ga), stannum (Sn), zirconium (Zr), hafnium (Hf), titanium (Ti), and zinc (Zn). In an embodiment, the oxide semiconductor layer AO may include a Zn oxide-based material, for example, Zn oxide, In—Zn oxide, Ga—In—Zn oxide, or the like. In an embodiment, the oxide semiconductor layer AO may include IGZO semiconductor in which a metal such as indium (In) or gallium (Ga) is included in ZnO.

The source region and the drain region of the oxide semiconductor layer AO may be formed by making the oxide semiconductor conductive by adjusting the carrier concentration thereof. In one embodiment, for example, the source regions and the drain regions of the oxide semiconductor layer AO may be formed by increasing the carrier concentration through plasma treatment on an oxide semiconductor using hydrogen (H)-based gas, fluorine (F)-based gas, or any combination thereof.

A gate electrode GE may be on the oxide semiconductor layer AO, and a second gate insulating layer 117 may be between the oxide semiconductor layer AO and the gate electrode GE. The gate electrode GE is arranged to overlap the oxide semiconductor layer AO and is insulated from the oxide semiconductor layer AO by the second gate insulating layer 117.

The second gate insulating layer 117 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The second gate insulating layer 117 may have a single layer structure or a multilayer structure, each layer including at least one selected from the above-described inorganic insulating material. The second gate insulating layer 117 may be provided in a pattern similar to the shape of the gate electrode GE, instead of being formed on the entire surface of the substrate 100. The second gate insulating layer 117 does not cover both ends of the oxide semiconductor layer AO and may be provided to expose the source region and the drain region of the oxide semiconductor layer AO.

A second interlayer insulating layer 119 may be on the gate electrode GE, and a source electrode SE and/or a drain electrode DE connected to the oxide semiconductor layer AO may be on the second interlayer insulating layer 119. A conductive layer CM may be on the second interlayer insulating layer 119. The conductive layer CM may be a connection electrode that electrically connects one electrode of the transistors of the pixel circuit PC to the pixel electrode 310.

In an embodiment, a data line configured to transmit a data signal and a driving voltage line configured to transmit a driving voltage may be on the second interlayer insulating layer 119. The source electrode SE and the drain electrode DE may be connected to the data line or the driving voltage line directly or through another thin-film transistor.

The second interlayer insulating layer 119 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The second interlayer insulating layer 119 may have a single layer structure or a multilayer structure, each layer including at least one selected from the above-described inorganic insulating material.

An organic insulating layer 120 may be on the second interlayer insulating layer 119, and an organic light emitting diode ("OLED") may be on the organic insulating layer 120 as a display element electrically connected to the pixel circuit PC.

In such an embodiment, the oxide thin-film transistor TFTo includes an oxide semiconductor having a small leakage current due to characteristics thereof, the charge implanted region may not be arranged in the second gate insulating layer 117.

Figure 15:
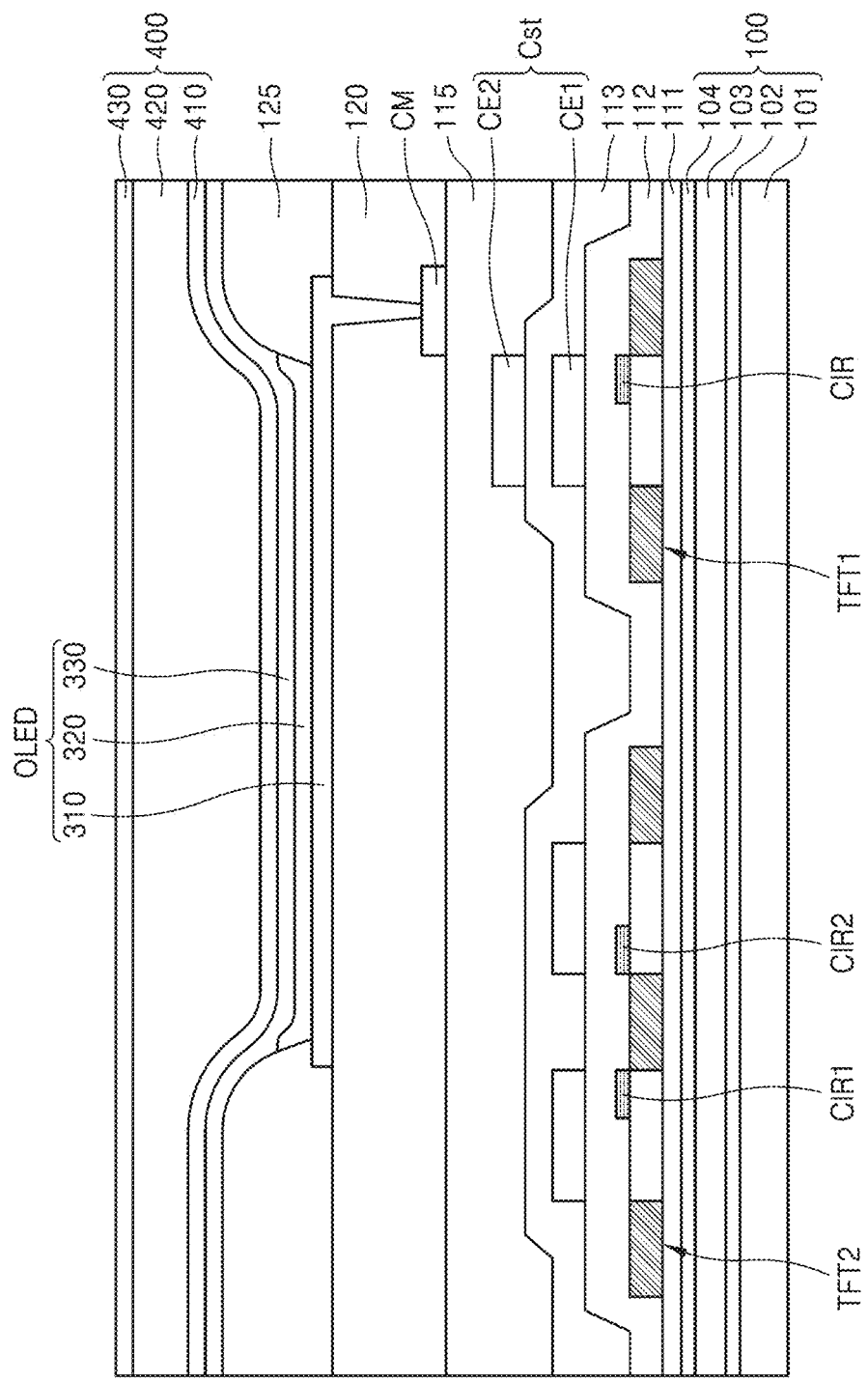
FIG. 15 is a cross-sectional view schematically illustrating a display apparatus according to another alternative embodiment.

FIG. 15 is a schematic cross-sectional view of a display apparatus, according to another alternative embodiment. In FIG. 15, the same or like reference numerals as those in FIG. 13 denote the same or like elements, and any repetitive detailed descriptions thereof will be omitted or simplified.

Referring to FIG. 15, an embodiments of the display apparatus includes a substrate 100, a pixel circuit PC on the substrate 100, and an organic light-emitting diode OLED electrically connected to the pixel circuit PC. The pixel circuit PC may include a first thin-film transistor TFT1, a second thin-film transistor TFT2, and a capacitor Cst. In such an embodiment, the pixel circuits PC1 to PC3 described above with reference to FIGS. 11 and 12 or various pixel circuits applicable to the display apparatus may be applied as the pixel circuit PC.

The first thin-film transistor TFT1 may be the thin-film transistor TFT described with reference to FIG. 2, or may be a driving thin-film transistor. The second thin-film transistor TFT2 may be the thin-film transistor TFT' described above with reference to FIG. 4, or may be a switching thin-film transistor having a dual gate structure.

A charge implanted region CIR of the first thin-film transistor TFT1 may overlap a channel region of a semiconductor layer and may be arranged close to a drain region. In the second thin-film transistor TFT2, a first charge implanted region CIR1 and a second charge implanted region CIR2 may be arranged close to a conductive region between a first channel region and a second channel region.

In such an embodiment, the display apparatus may further include a thin-film encapsulation layer 400 covering the organic light-emitting diode OLED.

Because the organic light-emitting diode OLED may be easily damaged by external moisture or oxygen, the organic light-emitting diode OLED may be covered and protected by the thin-film encapsulation layer 400. The thin-film encapsulation layer 400 may cover a display area DA and may extend to the outside of the display area DA. The thin-film encapsulation layer 400 may include at least one organic encapsulation layer and at least one inorganic encapsulation layer. In one embodiment, for example, the thin-film encapsulation layer 400 may include a first inorganic encapsulation layer 410, an organic encapsulation layer 420, and a second inorganic encapsulation layer 430.

The first inorganic encapsulation layer 410 may cover an opposite electrode 330 and may include silicon oxide (SiO$_2$), silicon nitride (SiN$_x$), silicon oxynitride (SiON), or the like. Although not illustrated, other layers such as a capping layer may be between the first inorganic encapsulation layer 410 and the opposite electrode 330 when necessary. Because the first inorganic encapsulation layer 410 is formed along a structure therebelow, the upper surface of the first inorganic encapsulation layer 410 may not be flat. The organic encapsulation layer 420 may cover the first inorganic encapsulation layer 410. Unlike the first inorganic encapsulation layer 410, the upper surface of the organic encapsulation layer 420 may be substantially flat. Specifically, the organic encapsulation layer 420 may have a substantially flat upper surface in a portion corresponding to the display area DA. The organic encapsulation layer 420 may include at least one selected from polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include silicon oxide (SiO$_2$), silicon nitride (SiN$_x$), silicon oxynitride (SiON), or the like.

Even when cracks occur in the thin-film encapsulation layer 400 through the above-described multilayer structure, the thin-film encapsulation layer 400 may prevent such cracks from being connected between the first inorganic encapsulation layer 410 and the organic encapsulation layer 420 or between the organic encapsulation layer 420 and the second inorganic encapsulation layer 430. Accordingly, the formation of a path through which external moisture or oxygen penetrates into the organic light-emitting diode OLED may be effectively prevented or substantially minimized.

In such an embodiment, the substrate 100 is a flexible substrate and may include a first base layer 101, a first inorganic barrier layer 102, a second base layer 103, and a second inorganic barrier layer 104, which are sequentially stacked. The first base layer 101 and the second base layer 103 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

Each of the first inorganic barrier layer 102 and the second inorganic barrier layer 104 is a barrier layer configured to prevent infiltration of external impurities. Each of the first inorganic barrier layer 102 and the second inorganic barrier layer 104 may include an inorganic material such as silicon oxide (SiO$_2$), silicon nitride (SiN$_x$), and silicon oxynitride (SiON) and may have a single-layer structure or a multilayer structure.

As described above, in embodiments of the thin-film transistor substrate and the display apparatus including the thin-film transistor substrate, the charge implanted region overlapping the channel region of the semiconductor layer is provided in the gate insulating layer to minimize the leakage current.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A thin-film transistor substrate comprising:
a substrate;
a semiconductor layer on the substrate, wherein the semiconductor layer comprises a first conductive region, a second conductive region, and a first channel region between the first conductive region and the second conductive region;
a gate insulating layer on the semiconductor layer, wherein the gate insulating layer comprises a first charge implanted region which overlaps a portion of the first channel region and into which charged ions are implanted; and
a first gate electrode on the gate insulating layer to overlap the first channel region,
wherein a distance between a center of the first charge implanted region and one of the first conductive region and the second conductive region is less than a distance between a center of the first channel region and the one of the first conductive region and the second conductive region when viewed in a thickness direction of the substrate.

2. The thin-film transistor substrate of claim 1, wherein the first conductive region and the second conductive region comprise a P-type dopant, and
the charged ions implanted into the first charge implanted region have a negative charge.

3. The thin-film transistor substrate of claim 2, wherein the charged ions implanted into the first charge implanted region comprise at least one selected from F$^-$, Cl$^-$, O$^{2-}$, and P$^{3-}$.

4. The thin-film transistor substrate of claim 1, wherein a concentration of the charged ions implanted into the first charge implanted region is less than a concentration of a dopant doped into the first conductive region.

5. The thin-film transistor substrate of claim 1, wherein an area of the first charge implanted region is less than about a half of an area of the first channel region.

6. The thin-film transistor substrate of claim 1, wherein a width of the first charge implanted region is less than about a half of a width of the first channel region.

7. The thin-film transistor substrate of claim 1, wherein the first charge implanted region is shifted to the second conductive region, and
the second conductive region is a drain region.

8. The thin-film transistor substrate of claim 1, wherein the semiconductor layer further comprises a second channel region apart from the first channel region, and
the gate insulating layer further comprises a second charge implanted region overlapping the second channel region,
wherein the second conductive region is between the first channel region and the second channel region.

9. The thin-film transistor substrate of claim 8, wherein
a distance between the center of the first charge implanted region and the second conductive region is less than a distance between the center of the first channel region and the second conductive region, and
a distance between a center of the second charge implanted region and the second conductive region is less than a distance between a center of the second channel region and the second conductive region.

10. The thin-film transistor substrate of claim 1, wherein a thickness of the first charge implanted region is less than a thickness of the gate insulating layer.

* * * * *